United States Patent
Yang et al.

(10) Patent No.: US 8,072,803 B2
(45) Date of Patent: Dec. 6, 2011

(54) MEMORY DEVICE AND METHODS FOR FABRICATING AND OPERATING THE SAME

(75) Inventors: I-Chen Yang, Hsinchu (TW); Guan-Wei Wu, Hsinchu (TW); Po-Chou Chen, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 163 days.

(21) Appl. No.: 12/471,660

(22) Filed: May 26, 2009

(65) Prior Publication Data

US 2010/0302845 A1 Dec. 2, 2010

(51) Int. Cl.
*G11C 16/04* (2006.01)

(52) U.S. Cl. ............ 365/185.03; 365/185.18; 257/311

(58) Field of Classification Search ............. 365/185.03, 365/185.18; 257/311
See application file for complete search history.

(56) References Cited

U.S. PATENT DOCUMENTS

| 6,674,132 B2 | 1/2004 | Willer |
| 6,987,298 B2 | 1/2006 | Lee et al. |
| 2007/0093023 A1 * | 4/2007 | Wu ............................ 438/257 |
| 2007/0105308 A1 | 5/2007 | Hosaka et al. |
| 2008/0217673 A1 | 9/2008 | Maruyama et al. |
| 2009/0039405 A1 * | 2/2009 | Cheng et al. .................. 257/311 |

FOREIGN PATENT DOCUMENTS

| CN | 1953183 | 4/2007 |
| CN | 1979865 | 6/2007 |
| TW | I278988 | 4/2007 |

* cited by examiner

*Primary Examiner* — Huan Hoang
(74) *Attorney, Agent, or Firm* — J.C. Patents

(57) ABSTRACT

The memory device is described, which includes a substrate, a conductive layer, a charge storage layer, a plurality of first doped regions and a plurality of second doped regions. The substrate has a plurality of trenches formed therein. The conductive layer is disposed on the substrate and fills the trenches. The charge storage layer is disposed between the substrate and the conductive layer. The first doped regions are configured in the substrate adjacent to both sides of an upper portion of each trench, respectively. The first doped regions between the neighbouring trenches are separated from each other. The second doped regions are configured in the substrate under bottoms of the trenches, respectively. The second doped regions and the first doped regions are separated from each other, such that each memory cell includes six physical bits.

24 Claims, 20 Drawing Sheets

MEMORY DEVICE AND METHODS FOR FABRICATING AND OPERATING THE SAME

BACKGROUND OF THE INVENTION

1. Field of the Invention

The present invention generally relates to a semiconductor device. More particularly, the present invention relates to a memory device, and to a fabricating method and an operating method of the same.

2. Description of Related Art

A memory is a semiconductor device designed for storing information or data. As the functions of computer microprocessors become more and more powerful, programs and operations executed by software are increasing correspondingly. Consequentially, the demand for high storage capacity memories is getting more. Among various types of memory products, a non-volatile memory allows multiple-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures known as electrically erasable programmable read-only memory (EEPROM) and flash memory are used in a variety of modern applications. A typical flash memory is designed with an array of memory cells that can be independently programmed and read. The conventional flash memory cells store charge on a floating gate. When the memory is programmed, the electrons injected into the floating gate uniformly distributes in the polysilicon layer. However, when there are defects in the tunnel oxide layer under the polysilicon floating gate, the leakage is easily produced in the device. Hence, the reliability of the device is compromised.

Another type of the flash memory uses a charge-trapping structure, such as a layer of non-conductive SiN material, rather than the conductive gate material used in floating gate devices. When a charge-trapping cell is programmed, the charge is trapped and does not move through the non-conductive layer. The charge is retained by the charge trapping layer until the cell is erased, retaining the data state without continuously applied electrical power. In addition, the electrons are only stored in a portion of the charge trapping layer over the channel region adjacent to the source region or drain region when the device is programmed. Because the charge does not move through the non-conductive charge trapping layer, charge can be localized on different charge-trapping sites.

Conventionally, there are two physically separated storage sites in a memory cell with planar channel, which is considered as a 2-bit-per-cell memory device. The only way for increasing storage density is achieved by scaling the cell length of the planar channel cell. When the cell length is scaled down, the planar channel cell is prone to worse programming disturbance and higher resistance of the source and drain regions.

In order to increase the number of bits in a unit cell, a memory structure defined by trenches with a vertical memory cell is developed. There are four storage sites in a single vertical channel cell, which can be considered as a 4-bit-per-cell memory device. However, the electrons punch through easily between two bottom junctions, and the leakage in the memory structure is induced severely. The programming disturbance usually occurs due to the close deployment of neighboring trenches. Besides, threshold voltage Vt of a target bit can be affected by a bit state nearby, if the neighboring vertical channel cells are too close to each other and not well isolated.

SUMMARY OF THE INVENTION

Accordingly, the present invention is directed to a memory device capable of increasing the number of bits in a unit cell.

The present invention is also directed to a method for fabricating a memory device with high density of storage regions.

The present invention is still directed to a method for operating a memory device that is free of mutual perturbation.

To achieve these and other advantages and in accordance with the purpose of the invention, as embodied and broadly described herein, the invention provides a memory device. The memory device includes a substrate, a conductive layer, a charge storage layer, a plurality of first doped regions and a plurality of second doped regions. The substrate has a plurality of trenches formed therein. The conductive layer is disposed on the substrate and fills the trenches. The charge storage layer is disposed between the substrate and the conductive layer. The first doped regions are configured in the substrate adjacent to both sides of an upper portion of each trench, respectively. The first doped regions between the neighbouring trenches are separated from each other. The second doped regions are configured in the substrate under bottoms of the trenches, respectively. The second doped regions and the first doped regions are separated from each other, such that each memory cell includes six physical bits.

According to an embodiment of the present invention, the trenches include sloped sidewalls.

According to an embodiment of the present invention, an extending direction of the bottoms of the trenches and sidewalls of the trenches form an included angle within a range of 75° to 90°.

According to an embodiment of the present invention, the bottoms of the trenches are orthogonal, rounded or polygonal.

According to an embodiment of the present invention, the second doped regions can be right below the bottoms of the trenches, or can further extend from the bottoms of the trenches to both sides of a lower portion of each trench respectively.

According to an embodiment of the present invention, the memory device further includes a well region configured in the substrate, wherein a dopant concentration distributed over the well region varies with a depth of the substrate.

According to an embodiment of the present invention, the memory device further includes a bottom dielectric layer and a top dielectric layer. The bottom dielectric layer is disposed between the charge storage layer and the substrate. The top dielectric layer is disposed between the charge storage layer and the conductive layer.

According to an embodiment of the present invention, a material of the charge storage layer includes silicon nitride or silicon-rich nitride.

The method for fabricating the memory device of the present invention is described as follows. A substrate is provided, and a plurality of trenches is then formed therein. A plurality of first doped regions is formed in the substrate adjacent to both sides of an upper portion of each trench, respectively. The first doped regions between the neighbouring trenches are separated from each other. A plurality of second doped regions is formed in the substrate under bottoms of the trenches, respectively. A charge storage layer is formed conformally on the substrate and on a surface of the trenches. A conductive layer is formed on the charge storage layer and fills the trenches. Six physical bits are formed in the charge storage layer in a single memory cell at junctions of the first doped regions and the second doped regions, respectively.

According to an embodiment of the present invention, methods for forming the trenches, the first doped regions and the second doped regions may include following steps. A patterned mask layer is formed on the substrate. The first doped regions are formed in the substrate exposed by the patterned mask layer. Spacers are formed on sidewalls of the patterned mask layer, wherein the spacers cover a portion of the first doped region. The trenches are formed in the substrate exposed by the patterned mask layer and the spacers, wherein the trenches are through the first doped regions respectively. The second doped regions are formed under the bottoms of the trenches in the substrate exposed by the patterned mask layer and the spacers. The patterned mask layer and the spacers are removed.

According to an embodiment of the present invention, methods for forming the trenches, the first doped regions and the second doped regions may include following steps. The trenches are formed in the substrate. A patterned mask layer is formed on the substrate. The first doped regions and the second doped regions are formed simultaneously in the substrate exposed by the patterned mask layer. The patterned mask layer is removed. The patterned mask layer can be formed before the charge storage layer is formed or after the charge storage layer is formed.

According to an embodiment of the present invention, the trenches include sloped sidewalls.

According to an embodiment of the present invention, an extending direction of the bottoms of the trenches and sidewalls of the trenches form an included angle within a range of 75° to 90°.

According to an embodiment of the present invention, the bottoms of the trenches are orthogonal, rounded or polygonal.

According to an embodiment of the present invention, the method further includes following steps. A plurality of first contacts is formed on the first doped regions. A plurality of second contacts is formed on the second doped regions.

According to an embodiment of the present invention, the method further includes following steps. A bottom dielectric layer is formed between the charge storage layer and the substrate. A top dielectric layer is formed between the charge storage layer and the conductive layer.

The method for operating the memory device of the present invention is described as follows. A memory cell is provided, which includes a substrate, a conductive layer, a charge storage layer, two first doped regions and two second doped regions. The substrate has two trenches formed therein. The conductive layer is disposed on the substrate and fills the trenches. The charge storage layer is disposed between the substrate and the conductive layer. The first doped regions are configured in the substrate adjacent to both sides of an upper portion of each trench respectively, wherein the first doped regions between the neighbouring trenches are separated from each other. The second doped regions are configured in the substrate under bottoms of the trenches respectively, wherein the second doped regions and the first doped regions are separated from each other. Accordingly, six bits are formed in the charge storage layer at junctions of the first doped regions and the second doped regions, respectively. When performing a programming operation, a first voltage is applied to the conductive layer, a second voltage is applied to a selected doped region adjacent to a selected bit, a third voltage is applied to one of non-selected doped regions neighboring with the selected bit along the conductive layer, a fourth voltage is applied to the substrate, and the other two non-selected doped regions are floating. The first voltage is higher than the fourth voltage, and the second voltage is higher than the third voltage to program the selected bit by channel hot electron injection.

According to an embodiment of the present invention, the first voltage is about 9 V to 13 V, the second voltage is about 3.5 V to 5.5 V, the third voltage is about 0 V, and the fourth voltage is about 0 V.

According to an embodiment of the present invention, the memory cell can be operated as a multi-level cell (MLC).

According to an embodiment of the present invention, the method further performs an erasing operation after the programming operation is performed. When performing the erasing operation, a fifth voltage is applied to the conductive layer, a sixth voltage is applied to all doped regions, and a seventh voltage is applied to the substrate for block erasing. The fifth voltage and the sixth voltage induce hot hole injection to erase the selected block.

According to an embodiment of the present invention, the fifth voltage is about −5 V to −9 V, the sixth voltage is about 2.5 V to 5.5 V, and the seventh voltage is about 0 V to −2 V.

According to an embodiment of the present invention, the method further performs a reading operation after the programming operation is performed. When performing the reading operation, a eighth voltage is applied to the conductive layer, a ninth voltage is applied to the selected doped region adjacent to the selected bit, a tenth voltage is applied to one of the non-selected doped regions neighboring with the selected bit along the conductive layer, a eleventh voltage is applied to the substrate, and the other two non-selected doped regions are floating. The eighth voltage is defined by a read voltage for current level verification, and the tenth voltage is higher than the ninth voltage.

According to an embodiment of the present invention, the memory cell can be operated as a single-level cell (SLC), wherein the eighth voltage is about 4 V to 6 V, the ninth voltage is about 0 V, the tenth voltage is about 0.8 V to 1.6 V, and the eleventh voltage is about 0 V.

According to an embodiment of the present invention, the memory cell can be operated as a multi-level cell (MLC), wherein the eighth voltage is about 5 V to 7 V, the ninth voltage is about 0 V, the tenth voltage is about 0.8 V to 1.6 V, and the eleventh voltage is about 0 V.

As mentioned above, the memory device in the present invention includes a planar channel cell and a vertical channel cell, such that six physical bits are used for storing data in a single memory cell. Accordingly, the bit density can be increased, and the storage density is also enhanced without affecting the layout size.

Besides, the method for fabricating the memory device in the present invention forms the first doped regions adjacent to the upper portion of each trench and also forms the second doped regions under the bottoms of the trenches. Hence, the memory device to be formed can have a structure of 6-bit-per-cell with an enhance storage density.

Additionally, the method for operating the memory device in the present invention stores the electrons into the respective six bits of each memory cell for programming, and also injected the holes thereinto for erasing. Thus, the storage density is improved without mutual perturbation and programming disturbance.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
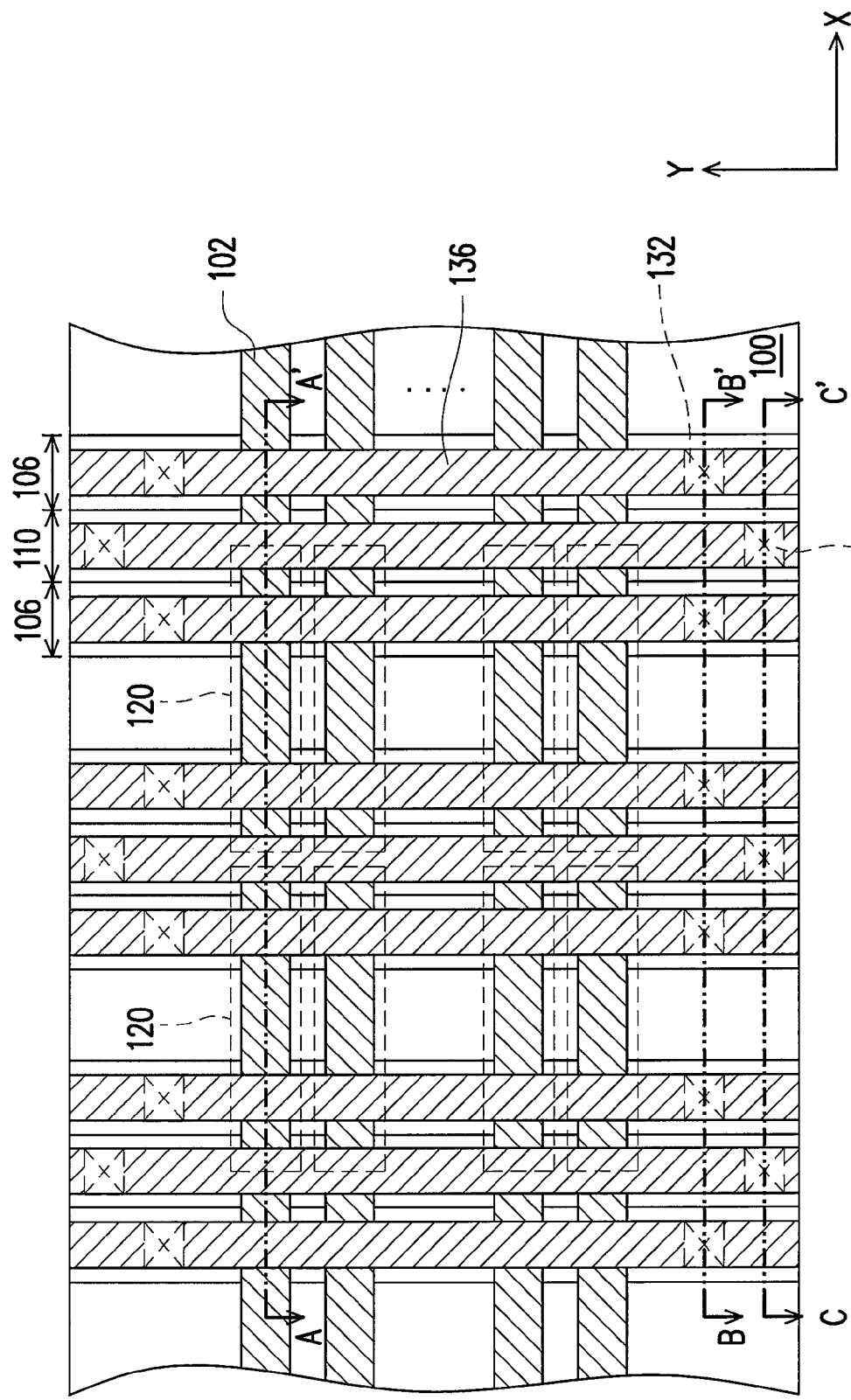
FIG. 1A schematically illustrates a top view layout of the memory device according to an embodiment of the present invention, in which the inter-layer dielectric (ILD) is hidden.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
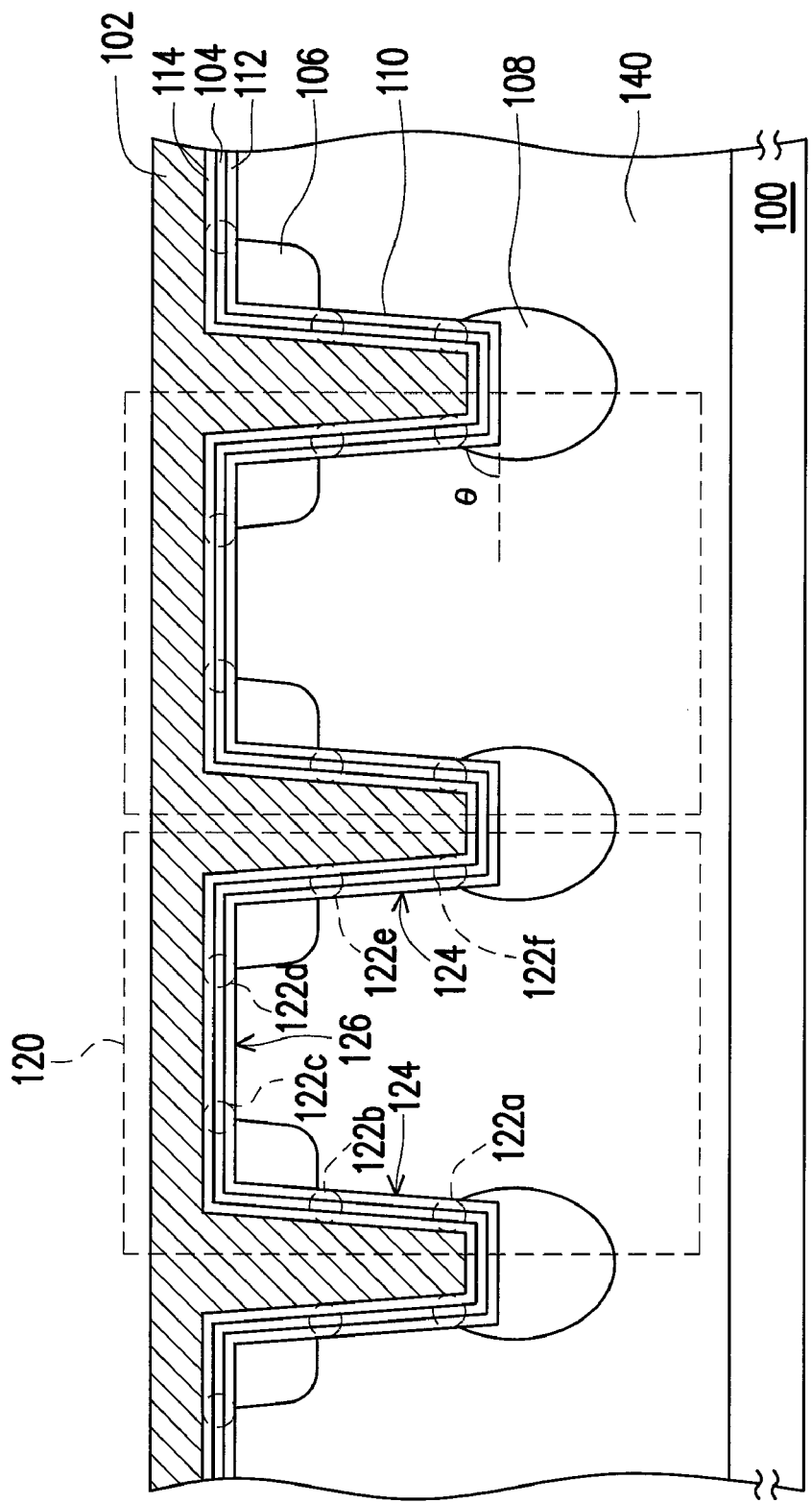
FIG. 1B is schematic, cross-sectional diagram of the memory device shown in FIG. 1A along line A-A' according to an embodiment of the present invention.
Figure 1C:
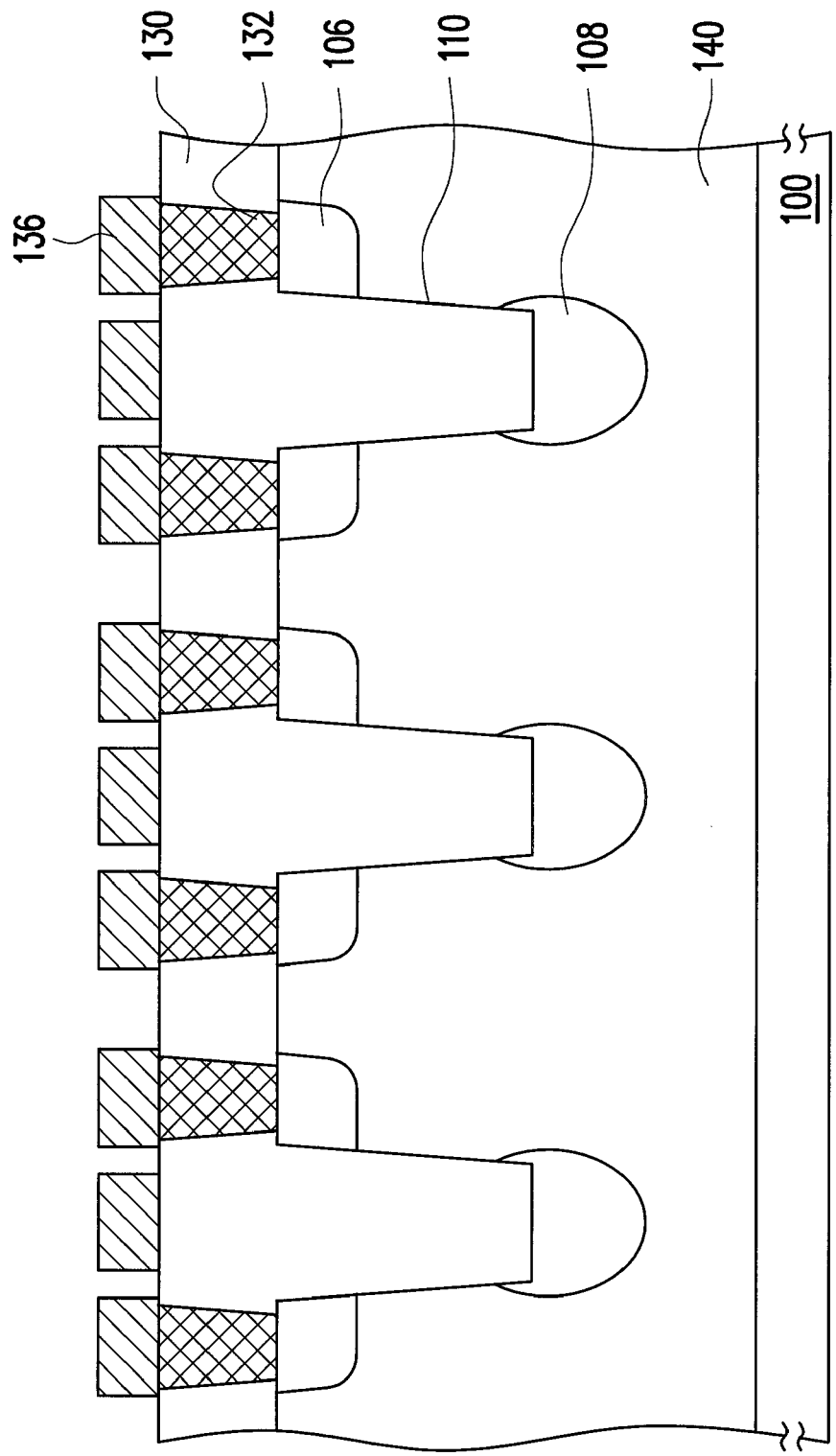
FIG. 1C is schematic, cross-sectional diagram of the memory device shown in FIG. 1A along line B-B' according to an embodiment of the present invention.
Figure 1D:
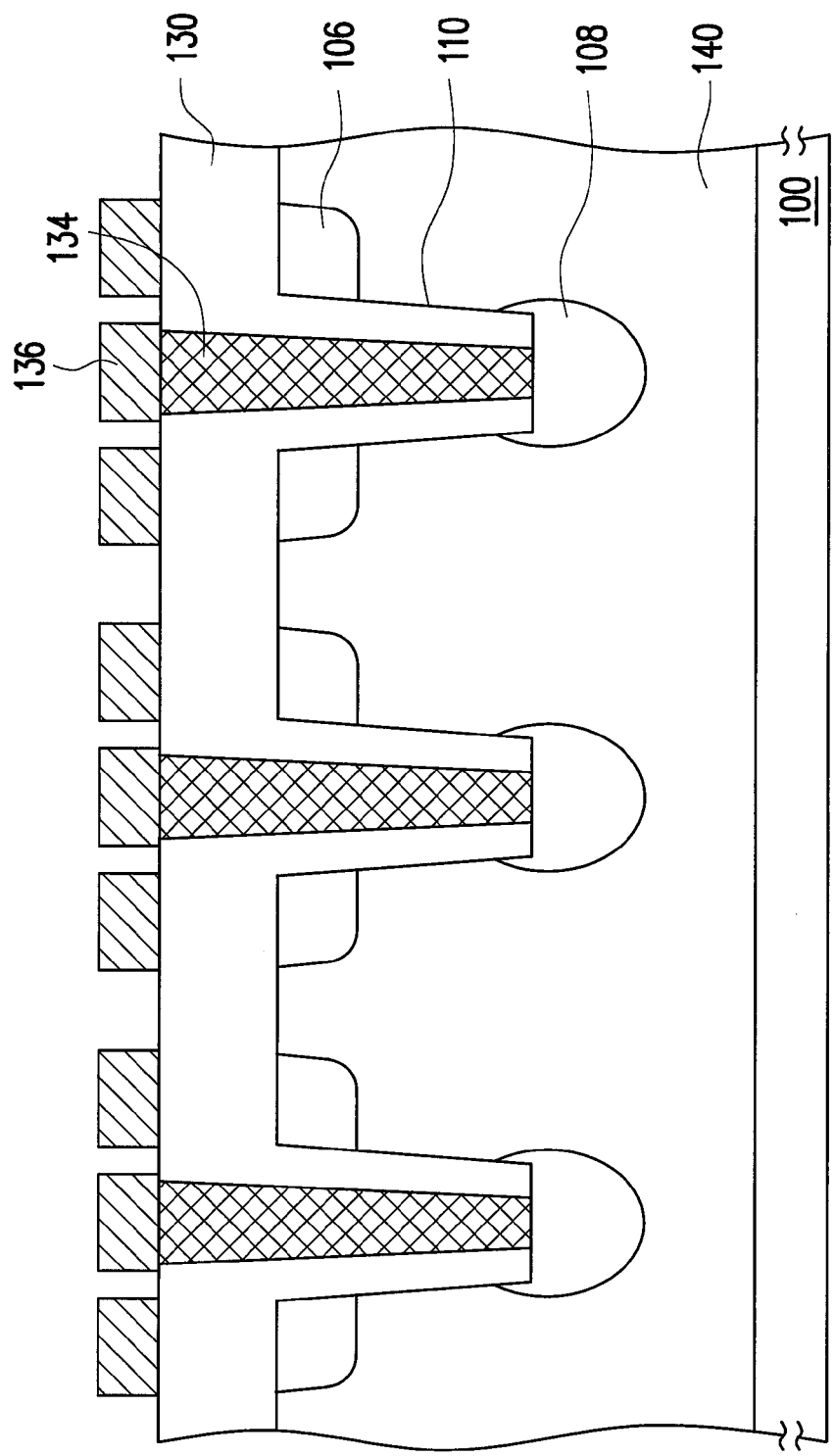
FIG. 1D is schematic, cross-sectional diagram of the memory device shown in FIG. 1A along line C-C' according to an embodiment of the present invention.
Figure 2:
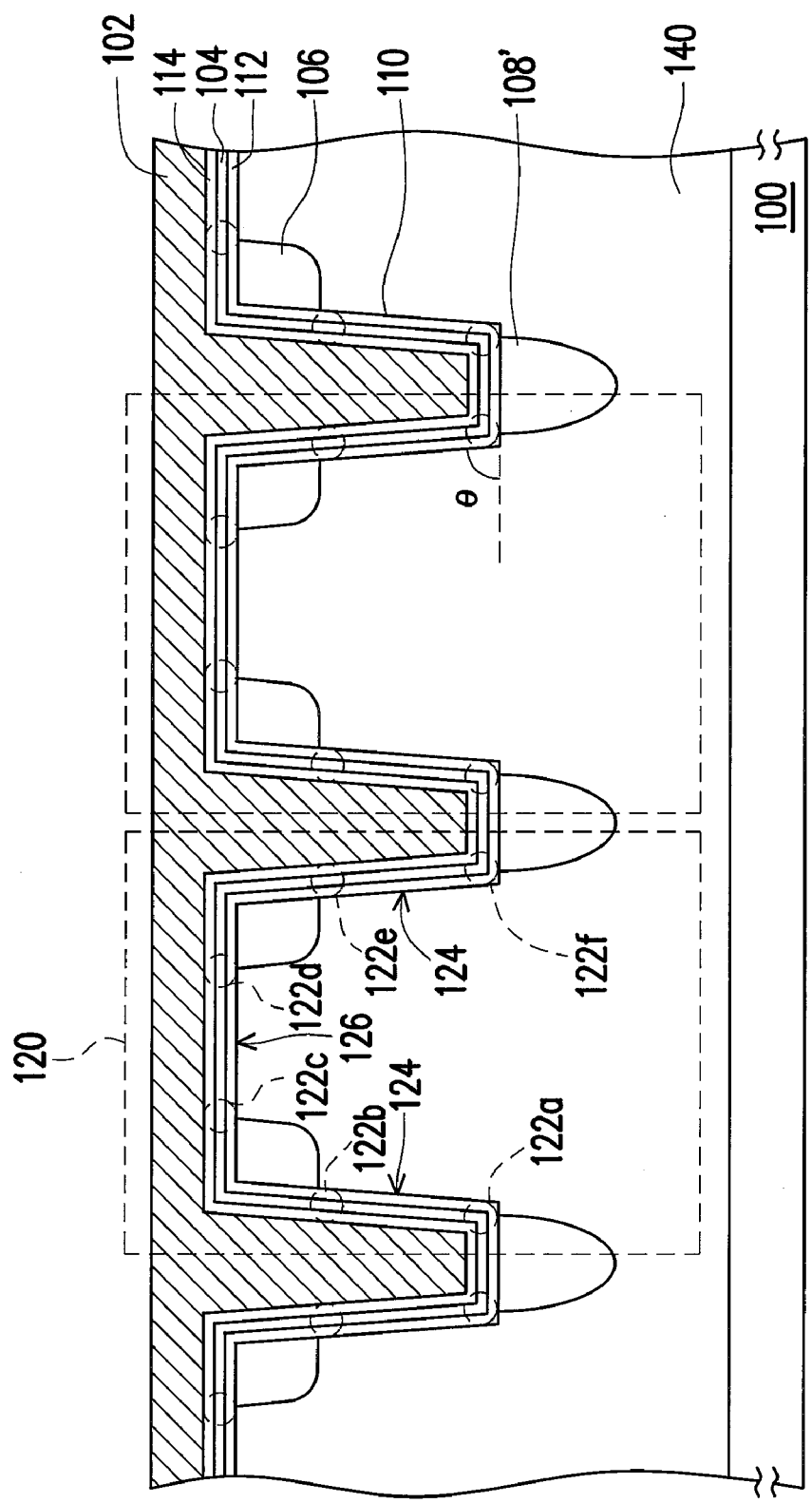
FIG. 2 is schematic, cross-sectional diagram of the memory device shown in FIG. 1A along line A-A' according to another embodiment of the present invention.

FIG. 1A schematically illustrates a top view layout of the memory device according to an embodiment of the present invention, in which the inter-layer dielectric (ILD) is hidden. FIG. 1B is schematic, cross-sectional diagram of the memory device shown in FIG. 1A along line A-A' according to an embodiment of the present invention. FIG. 1C is schematic, cross-sectional diagram of the memory device shown in FIG. 1A along line B-B' according to an embodiment of the present invention. FIG. 1D is schematic, cross-sectional diagram of the memory device shown in FIG. 1A along line C-C' according to an embodiment of the present invention. FIG. 2 is schematic, cross-sectional diagram of the memory device shown in FIG. 1A along line A-A' according to another embodiment of the present invention. The identical elements shown in FIGS. 1B and 2 are designated with the same reference numbers, and detailed descriptions of the same or like elements are omitted hereinafter.

Referring to FIGS. 1A and 1B concurrently, the memory device in an embodiment of the present invention includes a substrate 100, a conductive layer 102, a charge storage layer 104, a plurality of first doped regions 106 and a plurality of second doped regions 108. The substrate 100 may be a P-type or an N-type silicon substrate, a P-type or an N-type epi-silicon substrate or a P-type or an N-type semiconductor-on-insulator (SOI) substrate. A well region 140 is configured in the substrate 100. In an embodiment, when the device is a n-channel device, the well region 140 can be a P-well; when the device is a p-channel device, the well region 140 can be an N-well. In an embodiment, the well region 140 may be formed by multiple well implants, such that the dopant concentration distributed over the well region 140 varies with the depth. As a result, the well region 140 with an uneven distribution of the dopant concentration can control the threshold voltage (Vt) of the memory device to be formed. The substrate 100 has a plurality of trenches 110 formed therein. These trenches 110 are arranged in parallel to each other and disposed extensively in Y-direction. In an embodiment, an extending direction of bottoms of the trenches 110 and sidewalls of the trenches 110 form an included angle θ within a range of 75° to 90°. That is to say, the trenches 110 may have sloped sidewalls for a better diffusion profile of the second doped regions 108 nearby the corners of the trenches 110. Further, the pitch between neighboring trenches 110 may be adequately defined for providing sufficient space and avoiding the mutual perturbation.

The conductive layer 102 is disposed on the substrate 100 and fills the trenches 110. The conductive layer 102 can be made of doped polysilicon, metal, or a combination of polysilicon and metal. The conductive layer 102 is, for example, arranged in a bar layout and extends in X-direction. The conductive layer 102 can serve as word lines.

The charge storage layer 104 is disposed extensively between the conductive layer 102 and the substrate 100. The material of the charge storage layer 104 includes charge trapping materials, e.g. silicon nitride or silicon-rich nitride.

In an embodiment, a bottom dielectric layer 112 can be disposed under the charge storage layer 104, and a top dielectric layer 114 can be disposed on the charge storage layer 104, so as to form a complex dielectric layer. The bottom dielectric layer 112 is, for example, disposed between the charge storage layer 104 and the substrate 100. The bottom dielectric layer 112 may be a dielectric material in the form of a single-layer structure, such as a low-K material (e.g. silicon oxide) or a high-K material (e.g. HfAlO). Alternatively, the bottom dielectric layer 112 may be in the form of a multi-layered structure based on the band-gap engineering (BE) theory, so as to achieve the higher injection current and the faster programming speed and better retention. The bottom dielectric layer 112 consisting of multiple films is, for example, a stacked structure of low K/high K materials or a stacked structure of low K/high K/low K materials. The stacked structure of low K/high K materials can be silicon oxide/HfSiO, silicon oxide/$HfO_2$, or silicon oxide/silicon nitride. The stacked structure of low K/high K/low K materials can be silicon oxide/silicon nitride/silicon oxide, or silicon oxide/$Al_2O_3$/silicon oxide. The top dielectric layer 114 is, for example, disposed between charge storage layer 104 and the conductive layer 102. Likewise, the top dielectric layer 114 can be a dielectric material in the form of a single-layer structure, and the material thereof is, for example, silicon oxide, HfAlO or $Al_2O_3$. The top dielectric layer 114 can be in the form of a multi-layered structure based on the BE theory, such as stacked films of silicon nitride/silicon oxide, or silicon oxide/silicon nitride/silicon oxide.

The first doped regions 106 serving as diffusion of the memory device, e.g. buried diffusion (BD), are configured in the substrate 100 adjacent to both sides of each trench 110, respectively. More specifically, the first doped regions 106 are disposed beside an upper portion of the trenches 110, and the first doped regions 106 between the neighbouring trenches 110 are separated from each other. For illustration purposes, the following disclosure is described in terms of buried diffusion (BD), which is illustrated only as an exemplary example, and should not be adopted for limiting the scope of the present invention. The diffusion type of the devices is not particularly limited by the present invention.

The second doped regions 108 serving as buried diffusion (BD) are configured in the substrate 100 under the bottoms of the trenches 110, respectively. The second doped regions 108, for example, are separated from each other. The diffusion region of each second doped region 108 is parted from that of the first doped regions 106 corresponding to the same trench 110.

In an embodiment, as shown in FIG. 1B, the second doped regions 108 can further extend from the bottom of each trench 110 to both sides of a lower portion of each trench 110, respectively. In another embodiment, as shown in FIG. 2, the bottom corners of the trenches 110 may not be wrapped by the diffusion of the second doped regions 108'. In other words, the second doped regions 108' is configured right under the bottom of the trenches 110 without an extension to the sidewalls of the trenches 110. Therefore, the space between two adjacent second doped regions 108' can be lengthened and the punch immunity therebetween can be improved. Besides, program disturbance induced by the neighboring second doped regions 108' can be further suppressed.

It is noted that when the substrate 100 is P-type, dopants implanted into the first doped regions 106 and the second doped regions 108 can be N-type; when the substrate 100 is N-type, dopants implanted into the first doped regions 106 and the second doped regions 108 can be P-type.

In addition, referring to FIGS. 1A, 1C and 1D concurrently, the memory device in an embodiment of the present invention further includes contact plugs 132 and 134. The contact plugs 132 and 134 are, for example, formed in a dielectric layer 130 which serves as the ILD. The contact plugs 132 can be disposed on the first doped regions 106 and further connect the first doped regions 106 and a metal bit lines 136, respectively. Similarly, the contact plugs 134 can be disposed on the second doped regions 108 and further connect the second doped regions 108 and the metal bit lines 136, respectively. The metal bit lines 136 are, for example, arranged in a parallel layout extensively in Y-direction, which intersect with the word lines. In an embodiment, a salicide layer may be formed between the contact plugs 132 and the first doped regions 106 or between the contact plugs 134 and the second doped regions 108 for reducing the resistance at the interface.

The memory device of the present invention includes a plurality of memory cells 120. Two adjacent memory cells 120, for example, share a common second doped region 108, and the memory cells 120 can be electrically connected with each other in X-direction by the conductive layer 102 (i.e. word lines). Besides, each memory cell 120 is configured mirror-systematically.

In each of the memory cells 120, the charge storage layer 104 disposed between the conductive layer 102 and the substrate 100 may include six physical bits 122a, 122b, 122c, 122d, 122e and 122f. The region between the bits 122a and 122b or the region between the bits 122e and 122f, for example, serves as a vertical channel region 124. The region between the bits 122c and 122d, for example, serves as a planar channel region 126. Take a single memory cell 120 for example, the charge storage layer 104 located over the sidewall of the trench 110 at the junctions of the second doped regions 108, i.e. the bits 122a and 122f, can respectively store two bits of data. Similarly, the charge storage layer 104 located over the sidewall of the trench 110 at the junctions of the first doped regions 106, i.e. the bits 122b and 122e, can respectively store two bits of data, and the charge storage layer 104 located over the substrate 100 between adjacent trenches 110 at the junctions of the first doped regions 106, i.e. the bits 122c and 122d, can respectively store two bits of data.

Therefore, each memory cell 120 of the memory device in an embodiment of the present invention can store six bits of data. In other words, the memory device of the present invention is a 6-bit-per-cell non-volatile memory. In an embodiment, more than six bits of data can be stored in a single memory cell 120 with the aid of the multi-level cell (MLC) technique. By comparing with the conventional stacked memory device, more physical bits are obtained in the foregoing structure, and the storage density is relatively increased with the same array area.

Moreover, the depth of the trenches 110, the pitch between neighboring trenches 110 may be adequately defined for providing sufficient space between the adjacent vertical channel regions 124, so that the mutual perturbation can be well avoided. Besides, the length of the planar channel regions 126 depends on the miniaturized capability of the process, and the effective length of the planar channel regions 126 can be similar to that of the vertical channel regions 124, so as to possess an approximate threshold voltage (Vt). Alternatively, approximate threshold voltage (Vt) can also be achieved by suitable doping engineering in channel 124 and channel 126.

In an example, the pitch between neighboring trenches 110 is about 0.20 μm and the interval between two adjacent first doped regions 106 is about 0.08 μm, so that the lateral diffusion of each first doped region 106 has a width of about 0.06 μm. Each first doped region 106 may have a sufficient depth of about 0.06 μm by suitable junction engineering so as to lower the program disturbance between the planar channel regions 126 and the vertical channel regions 124. The depth of the trenches 110 could be designed as the sum of depth of the first doped regions 106, the effective length of the vertical channel regions 124 and the extending diffusion distance of the second doped regions 108, wherein the extending diffusion distance of the second doped regions 108 is considered as a distance further extending from the bottom of each trench 110 to the lower portion of each trench 110. In an example, when the depth of the first doped regions 106 is about 0.06 μm, the effective length of the vertical channel regions 124 is about 0.08 μm and the extending diffusion distance of the second doped regions 108 is about 0.02 μm, the depth of the trenches 110 could be around 0.16 μm.

Thus, the mutual effect upon Vt state of the adjacent vertical channel regions 124 in each single memory cell 120 can be well isolated due to the well-defined interval between the neighboring trenches 110. The programming disturbance induced by the second doped regions 108 can also be alleviated by sufficient distance between the neighboring second doped regions 108. The programming disturbance induced by the first doped regions 106 can be lowered by the formation of the deep diffusion.

Figure 3A:
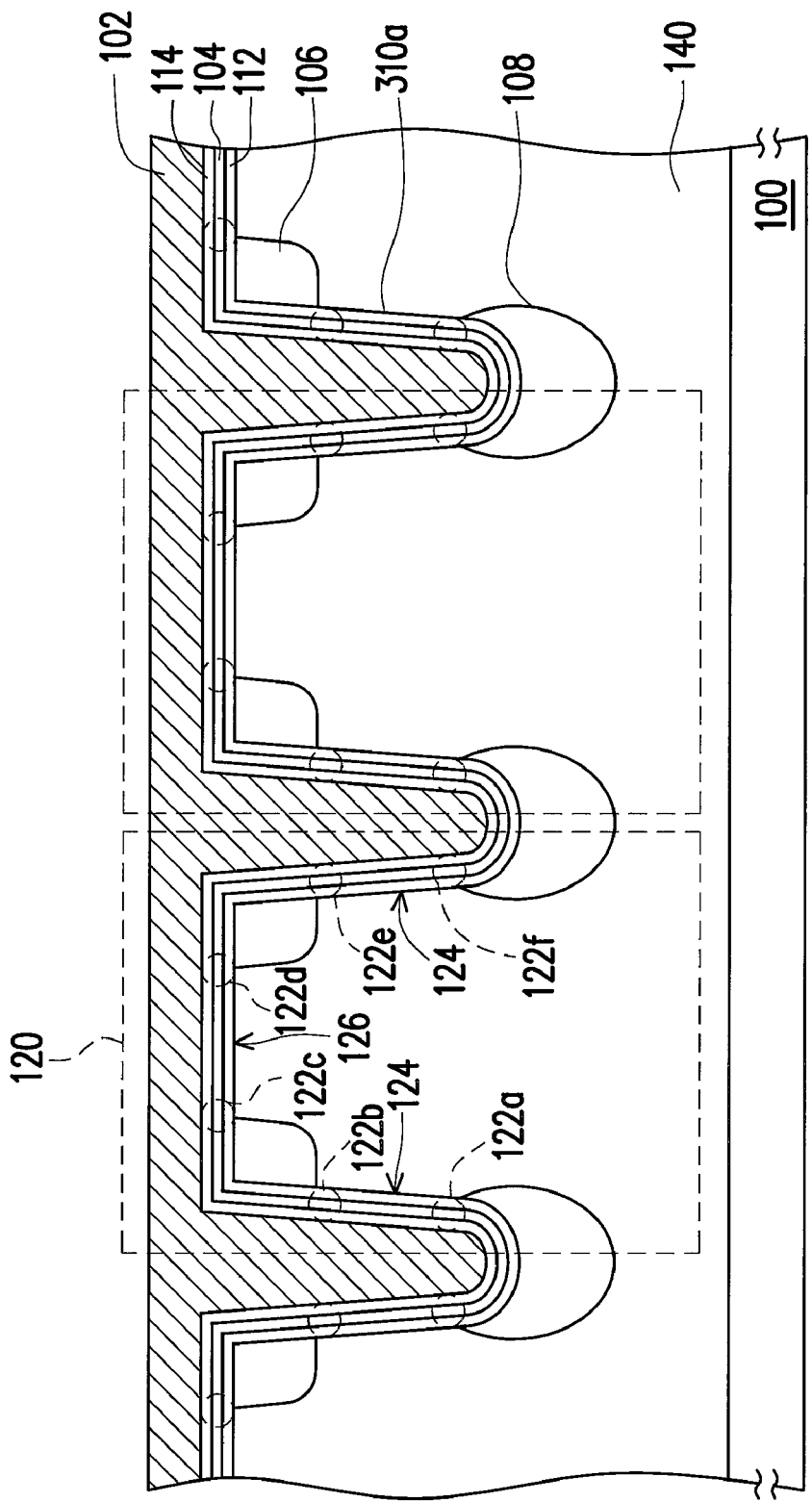
FIGS. 3A and 3B are schematic, cross-sectional diagram of the memory device shown in FIG. 1A along line A-A' according to other examples of the present invention.
Figure 3B:
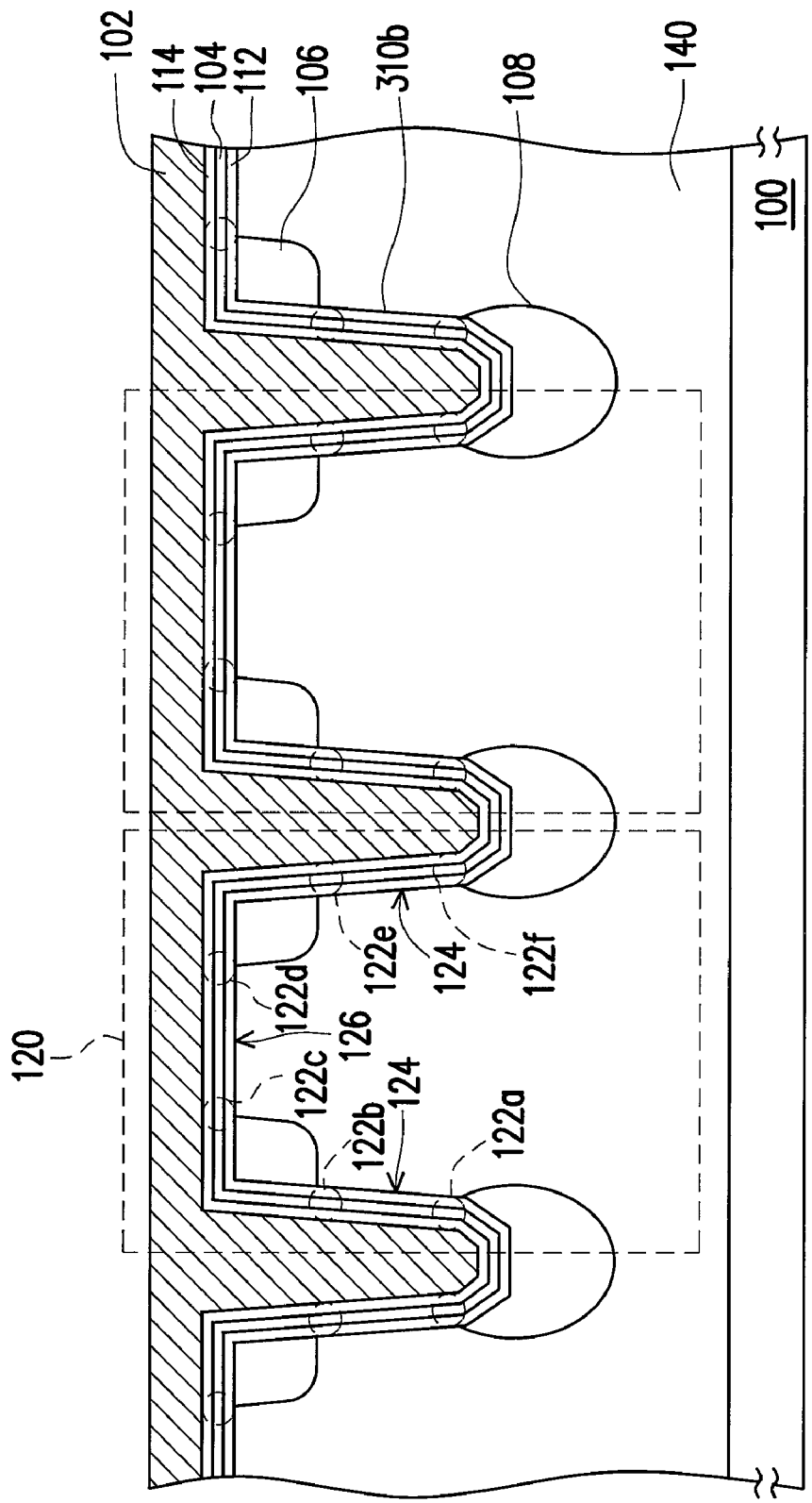

It should be noticed that each trench 110 with an approximately orthogonal bottom in the foregoing example is provided for illustration purposes, and is not construed as limiting the scope of the present invention. It is appreciated by persons skilled in the art that the bottoms of the trenches can be other shapes. FIGS. 3A and 3B are schematic, cross-sectional diagram of the memory device shown in FIG. 1A along line A-A' according to other examples of the present invention. The identical elements shown in FIGS. 1B, 3A and 3B are designated with the same reference numbers, and detailed descriptions of the same or like elements are omitted hereinafter.

In other examples, the structures of the memory device shown in FIGS. 3A and 3B are roughly identical to that shown in FIG. 1B, while the difference lies in the configuration of the bottom of each trench. Referring to FIG. 3A, the trenches 310a formed in the substrate 100 may have rounded bottoms, respectively. Referring to FIG. 3B, the bottom of each trench 310b formed in the substrate 100 is, for example, shaped as a polygonal contour.

The following description is provided to illustrate methods for operating the memory device in an embodiment of the present invention. These examples are provided to illustrate effects upon the programming, erasing and reading operation made by applying various bias to the first and second doped regions and to the conductive layer (word line), but is not intended to limit the scope of the present invention. A single memory cell 120 shown in FIG. 1B is introduced into the following as a simplified exemplary example.

FIGS. 4A-4F schematically depict, in a cross-sectional diagram, a programming operation of the memory device according to an embodiment of the present invention, respectively.

In the programming operation, a positive voltage Vp1 is applied to the word line WL which is connected to the selected memory cell. The voltage Vp1 is about 9 V to 13 V, for example. A positive voltage Vp2 is applied to a selected doped region which is connected with a selected bit. The voltage Vp2 is about 3.5 V to 5.5 V, for example. A voltage Vp3 is applied to one of the non-selected doped regions which neighbors with the selected bit along the word line WL, while the other two non-selected doped regions are floating. The voltage Vp3 is about 0 V, for example. A voltage Vp4 is applied to the substrate, that is, to the well region. The voltage Vp4 is about 0 V, for example. In this operation, the voltage Vp1 is higher than the voltage Vp4, and the voltage Vp2 is higher than the voltage Vp3. Under the aforesaid bias applied to the respective doped regions, hot electrons are sufficiently induced and injected into the charge storage layer near the selected doped region and trapped therein. Accordingly, the selected bit of the memory cell is programmed by the channel hot electron injection (CHEI).

It is noted that the single memory cell in an embodiment of the present invention can be, for example but not limited to, operated as the multi-level cell (MLC) by properly applying the voltages thereto, so as to store multiple levels of electrical state per physical bit according to different programming levels.

Figure 4A:
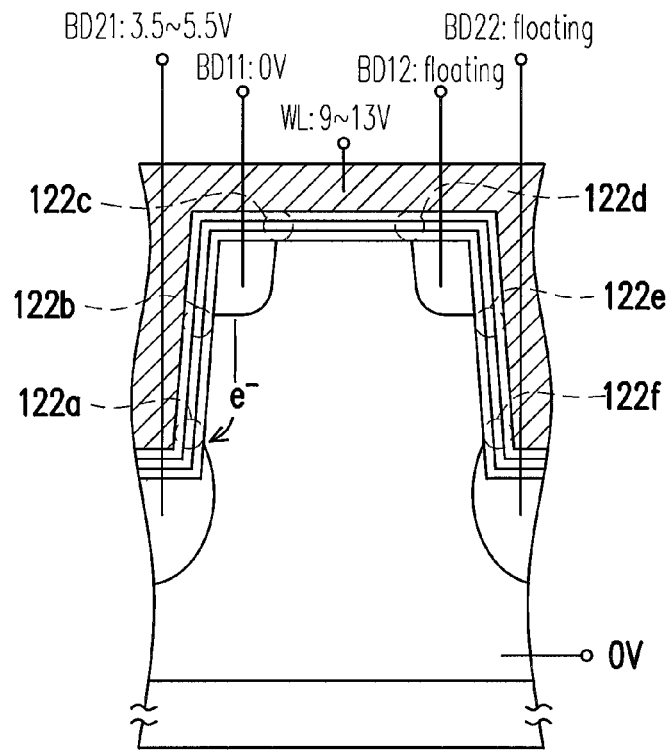
FIGS. 4A-4F schematically depict, in a cross-sectional diagram, a programming operation of the memory device according to an embodiment of the present invention, respectively.

As shown in FIG. 4A, the bit 122a of the memory cell is taken as an example, wherein the electrons are to be stored in the bit 122a. In the programming operation, the voltage Vp1 is applied to the word line WL. The voltage Vp2 is applied to the second doped region BD21 which is the selected doped region connected with the selected bit. The voltage Vp3 is applied to the first doped region BD11. The voltage Vp4 is applied to the well region. The first doped region BD12 and second doped region BD22 which are the non-selected doped regions are floating. When the positive bias is applied onto the word line WL and second doped region BD21, electrical fields along vertical channel is created to accelerate electrons from the first doped region BD11 to the bit 122a of the memory cell. As the electrons move along the channel, some of the electrons gain sufficient energy to jump over the potential barrier of the bottom dielectric layer, and are then trapped in the charge storage layer around the second doped region, that is, the bit 122a. Therefore, the bit 122a can be programmed owing to the aforesaid bias deployment.

Figure 4B:
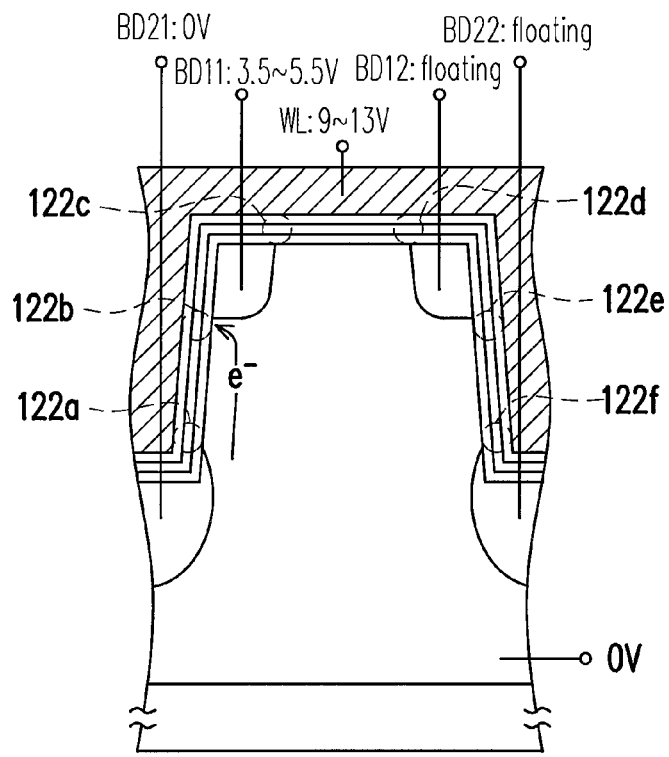

As shown in FIG. 4B, the bit 122b of the memory cell is taken as an example, wherein the electrons are to be stored in the bit 122b. In the programming operation, the voltage Vp1 is applied to the word line WL. The voltage Vp2 is applied to the first doped region BD11 which is the selected doped region connected with the selected bit. The voltage Vp3 is applied to the second doped region BD21. The voltage Vp4 is still applied to the well region. The first doped region BD12 and second doped region BD22 which are the non-selected doped regions are floating. As described above, the electrons are injected into the charge storage layer and are then trapped therein, and thus, the bit 122b can be programmed.

Figure 4C:
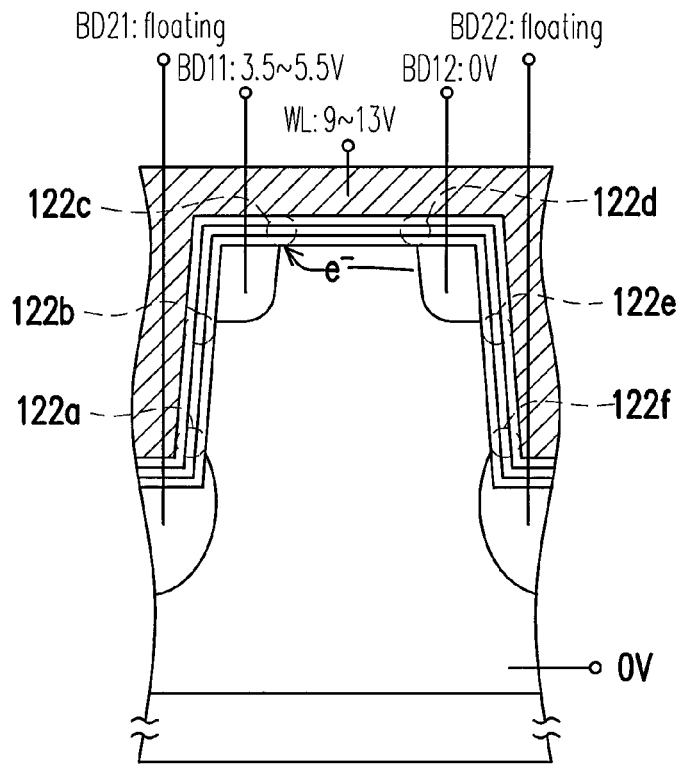

As shown in FIG. 4C, the bit 122c of the memory cell is taken as an example, wherein the electrons are to be stored in the bit 122c. In the programming operation, the voltage Vp1 is applied to the word line WL. The voltage Vp2 is applied to the first doped region BD11 which is the selected doped region connected with the selected bit. The voltage Vp3 is applied to the first doped region BD12. The voltage Vp4 is applied to the well region. The second doped regions BD21 and BD22 which are the non-selected doped regions are floating. As described above, the electrons are injected into the charge storage layer and are then trapped therein, and thus, the bit 122c can be programmed.

Figure 4D:
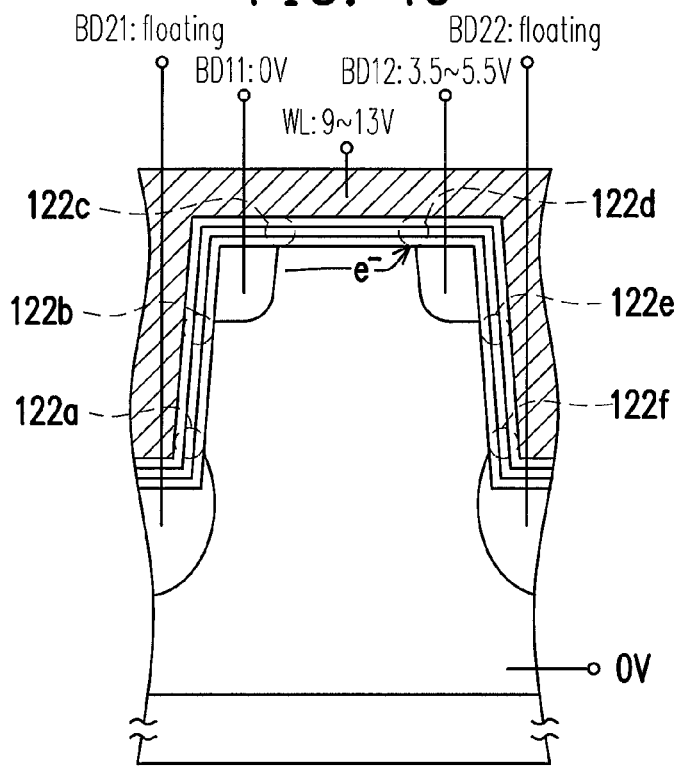

As shown in FIG. 4D, the bit 122d of the memory cell is taken as an example, wherein the electrons are to be stored in the bit 122d. In the programming operation, the voltage Vp1 is applied to the word line WL. The voltage Vp2 is applied to the first doped region BD12 which is the selected doped region connected with the selected bit. The voltage Vp3 is applied to the first doped region BD11. The voltage Vp4 is applied to the well region. The second doped regions BD21 and BD22 which are the non-selected doped regions are floating. As described above, the electrons are injected into the charge storage layer and are then trapped therein, and thus, the bit 122d can be programmed.

Figure 4E:
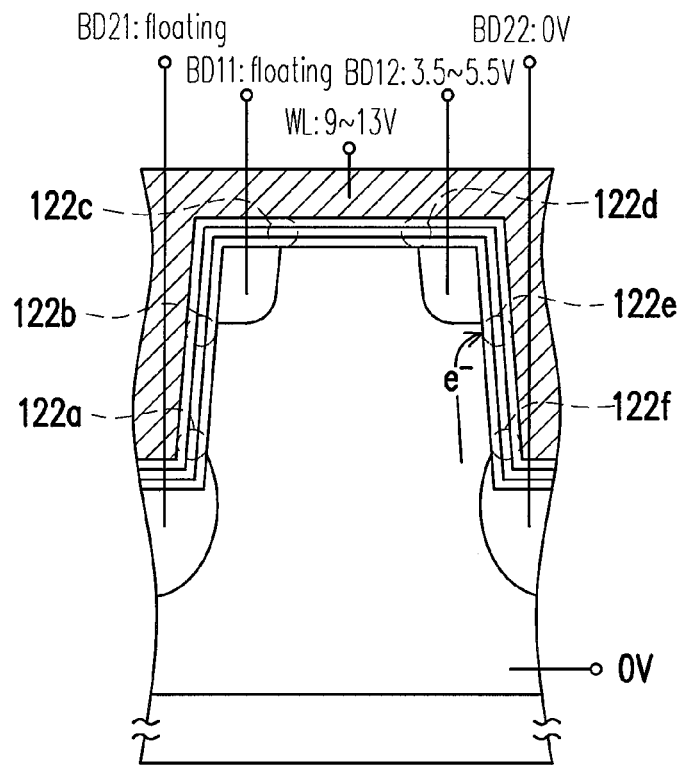

As shown in FIG. 4E, the bit 122e of the memory cell is taken as an example, wherein the electrons are to be stored in the bit 122e. In the programming operation, the voltage Vp1 is applied to the word line WL. The voltage Vp2 is applied to the first doped region BD12 which is the selected doped region connected with the selected bit. The voltage Vp3 is applied to the second doped region BD22. The voltage Vp4 is applied to the well region. The first doped region BD11 and the second doped regions BD21 which are the non-selected doped regions are floating. As described above, the electrons are injected into the charge storage layer and are then trapped therein, and thus, the bit 122e can be programmed.

Figure 4F:
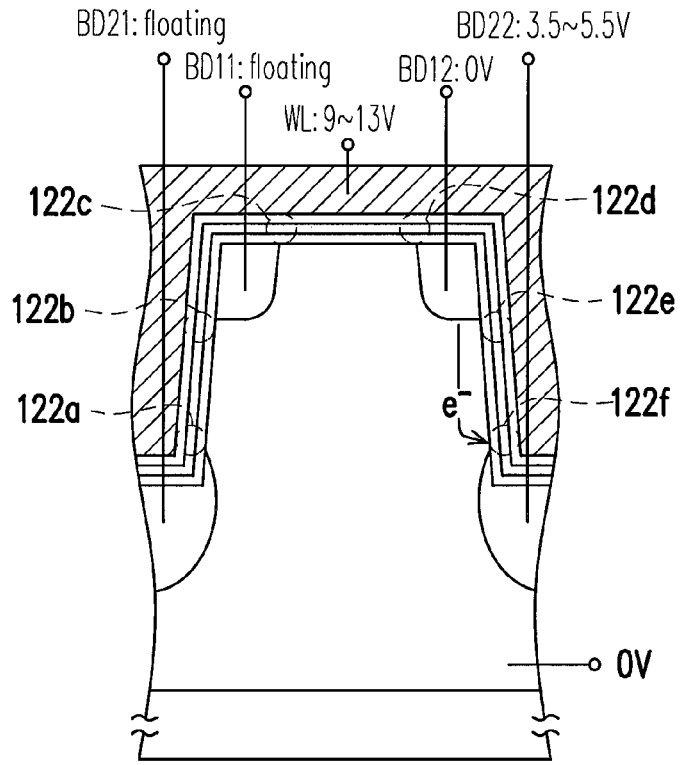

As shown in FIG. 4F, the bit 122f of the memory cell is taken as an example, wherein the electrons are to be stored in the bit 122f. In the programming operation, the voltage Vp1 is applied to the word line WL. The voltage Vp2 is applied to the second doped region BD22 which is the selected doped region connected with the selected bit. The voltage Vp3 is applied to the first doped region BD12. The voltage Vp4 is applied to the well region. The first doped region BD11 and the second doped regions BD21 which are the non-selected doped regions are floating. As described above, the electrons are injected into the charge storage layer and are then trapped therein, and thus, the bit 122f can be programmed.

Figure 5:
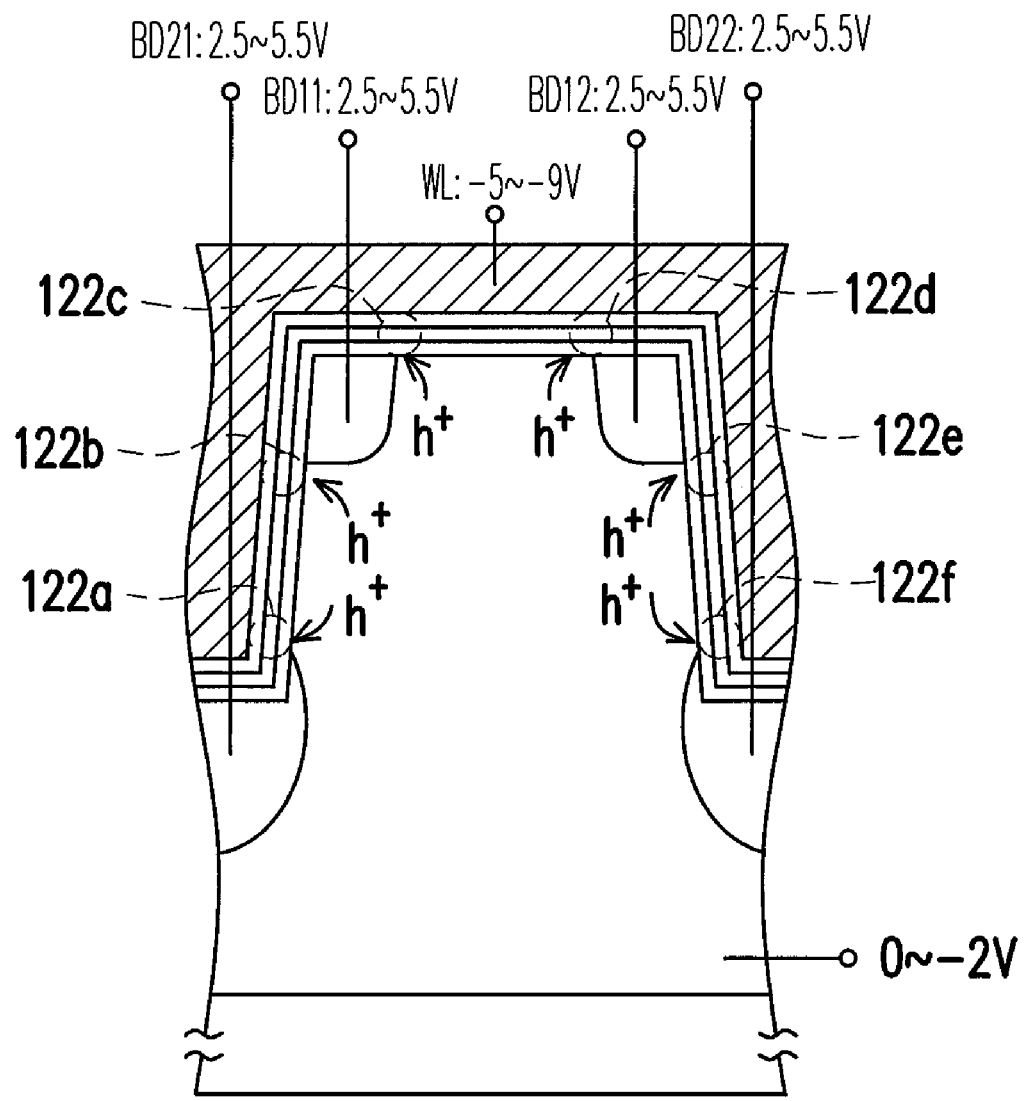
FIG. 5 schematically depicts, in a cross-sectional diagram, an erasing operation of the memory device according to an embodiment of the present invention.

FIG. 5 schematically depicts, in a cross-sectional diagram, an erasing operation of the memory device according to an embodiment of the present invention.

In the erasing operation after the selected bit is programmed, a negative voltage Ve1 is applied to the word line WL which is connected to the selected memory cell. The voltage Ve1 is about −5 V to −9 V, for example. A positive voltage Ve2 is applied to all doped regions for block erasing. The voltage Ve2 is about 2.5 V to 5.5 V, for example. A voltage Ve3 is applied to the substrate, that is, to the well region. The voltage Ve3 is about 0 V to −2 V, for example. In this operation, the voltage Ve1 and the voltage Ve2 can induce the band-to-band hot holes (BTBTHH), which are injected into the charge storage layer to erase six bits of each memory cell.

As shown in FIG. 5, the bits 122a, 122b, 122c, 122d, 122e and 122f of the memory cell are performed the erasing operation simultaneously in this example, wherein the electrons have been stored in at least one of the bits 122a, 122b, 122c, 122d, 122e and 122f. In the erasing operation, the negative voltage Ve1 is applied to the word line WL. The voltage Ve2 is applied to all doped regions BD11, BD12, BD21 and BD22. The voltage Ve3 is applied to the well region. When the negative bias is applied onto the word line WL and the positive bias is applied onto the doped regions BD11, BD12, BD21 and BD22, the holes can be injected into the charge storage layer to eliminate the negative charges stored therein, such that the bit 122a, 122b, 122c, 122d, 122e and 122f can be erased. Since the erasing operation is a block erasing operation, a single erasing operation is conducted for erasing the data stored in the bits of a plurality of memory cells located in a defined region at the same time.

FIGS. 6A-6F schematically depict, in a cross-sectional diagram, a reading operation of the memory device according to an embodiment of the present invention, respectively.

In the reading operation after the programming operation is performed, a positive voltage Vr1 is applied to the word line WL which is connected to the selected memory cell. The voltage Vr1 can be defined by the read voltage for bit state verification. When the memory cell is operated as the single-level cell (SLC), the voltage Vr1 is about 4 V to 6 V, for example. A voltage Vr2 is applied to the selected doped region which is connected with the selected bit. The voltage Vr2 is about 0 V, for example. A positive voltage Vr3 is applied to one of the non-selected doped regions which neighbors with the selected bit along the word line WL, while the other two non-selected doped regions are floating. The voltage Vr3 is about 0.8 V to 1.6 V, for example. A voltage Vr4 is applied to the substrate, that is, to the well region. The voltage Vr4 is about 0 V, for example. In this operation, the voltage Vr1 can be higher or lower than a threshold voltage of the selected bit, and the voltage Vr3 is higher than the voltage Vr2. By comparing the current read out by the bias conditions described above with the current level for bit state verification, the bit state of the memory cell and the digital information stored in the selected bit can be determined.

It should be noted that the foregoing embodiment in which a reverse read operation is performed for illustration purposes, and should not be construed as limiting the scope of the present invention. In the reverse read operation, the electrons flow from the selected doped region with the voltage Vr2 to the non-selected doped region with the voltage Vr3, which is in the reverse direction of the electrons for programming the selected bit. Accordingly, the bit state of the selected bit adjacent to the selected doped region can be read.

The single memory cell in an embodiment of the present invention can be, for example but not limited to, operated as the multi-level cell (MLC) for storing multiple levels of electrical state per bit according to different programming levels. When the memory cell is operated as the MLC, the bit state is determined by comparing the read current with the defined current level of each state. In an embodiment, the voltage Vr1 applied to the word line WL may be set about 5 V to 7 V.

Figure 6A:
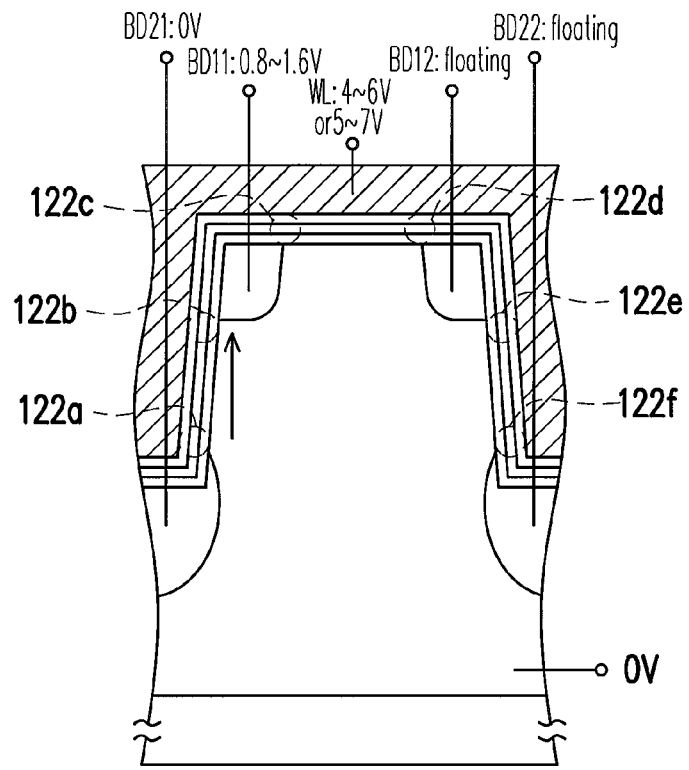
FIGS. 6A-6F schematically depict, in a cross-sectional diagram, a reading operation of the memory device according to an embodiment of the present invention, respectively.

As shown in FIG. 6A, the bit 122a of the memory cell is taken as an example, wherein the electrical state of the bit 122a is verified using the reverse read operation. In the reverse read operation, the voltage Vr1 is applied to the word line WL. The voltage Vr2 is applied to the second doped region BD21 that is the selected doped region connected with the selected bit. The voltage Vr3 is applied to the first doped region BD11. The voltage Vr4 is applied to the well region. The first doped region BD12 and second doped region BD22 that are not the non-selected doped regions are floating. Accordingly, the digital signal stored in the memory cell can be determined by verifying the magnitude of the current flowing in the channel. When the bias of 0 V is applied onto the second doped region BD21 and the positive bias is applied onto the first doped region BD11, the current flows from the second doped region BD21 to the first doped region BD11, such that the bit 122a can be read.

Figure 6B:
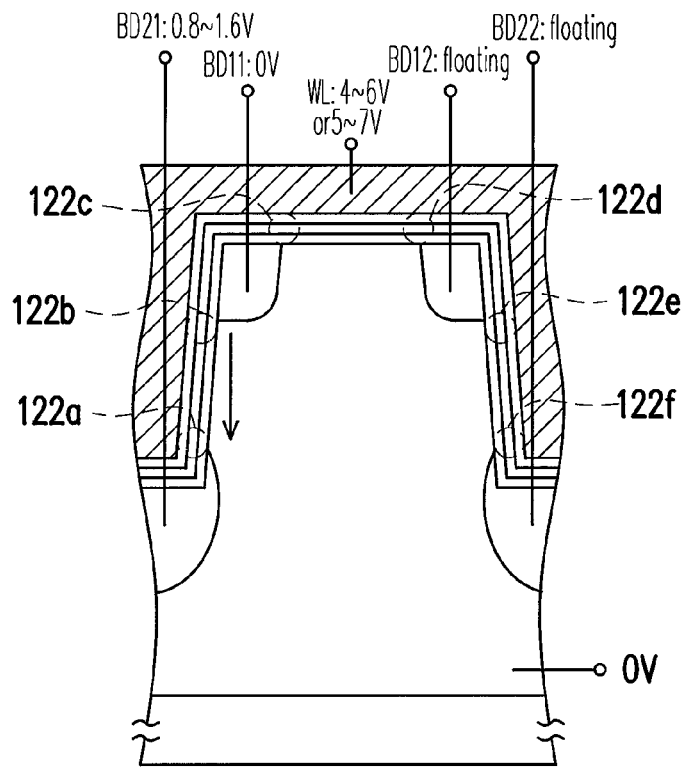

As shown in FIG. 6B, the bit 122b of the memory cell is taken as an example, wherein the electrons are stored in the bit 122b. In the reverse read operation, the voltage Vr1 is applied to the word line WL. The voltage Vr2 is applied to the first doped region BD11 that is the selected doped region connected with the selected bit. The voltage Vr3 is applied to the second doped region BD21. The voltage Vr4 is applied to the well region. The first doped region BD12 and second doped region BD22 which are not the non-selected doped regions are floating. Likewise, the current flows from the first doped region BD11 to the second doped region BD21, and accordingly, the bit 122b can be verified and read.

Figure 6C:
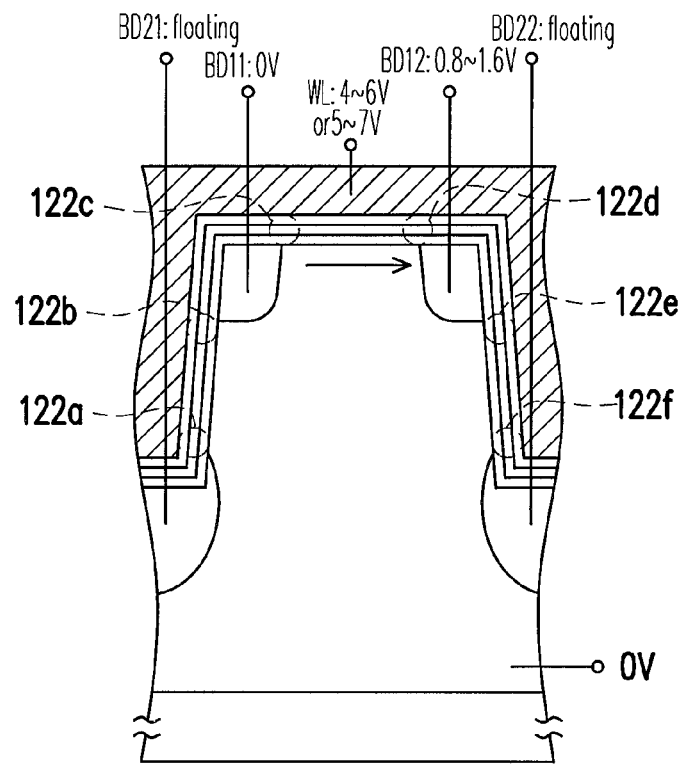

As shown in FIG. 6C, the bit 122c of the memory cell is taken as an example, wherein the electrons are stored in the bit 122c. In the reverse read operation, the voltage Vr1 is applied to the word line WL. The voltage Vr2 is applied to the first doped region BD11 which is the selected doped region connected with the selected bit. The voltage Vr3 is applied to the first doped region BD12. The voltage Vr4 is applied to the well region. The second doped regions BD21 and BD22 which are not the non-selected doped regions are floating. Likewise, the current flows from the first doped region BD11 to the first doped region BD12, and accordingly, the bit 122c can be verified and read.

Figure 6D:
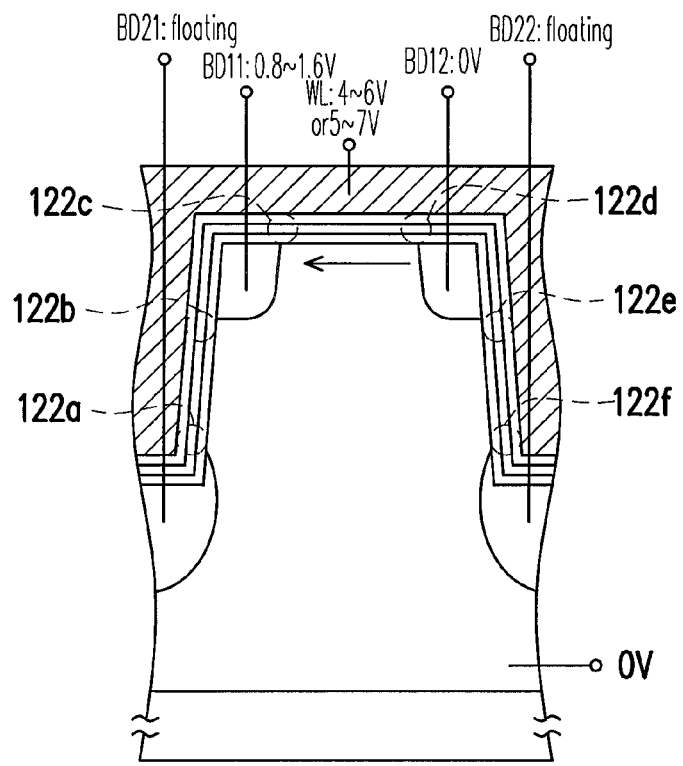

As shown in FIG. 6D, the bit 122d of the memory cell is taken as an example, wherein the electrons are stored in the bit 122d. In the reverse read operation, the voltage Vr1 is applied to the word line WL. The voltage Vr2 is applied to the first doped region BD12 which is the selected doped region connected with the selected bit. The voltage Vr3 is applied to the first doped region BD11. The voltage Vr4 is applied to the well region. The second doped regions BD21 and BD22 which are not the non-selected doped regions are floating. Likewise, the current flows from the first doped region BD12 to the first doped region BD11, and accordingly, the bit 122d can be verified and read.

Figure 6E:
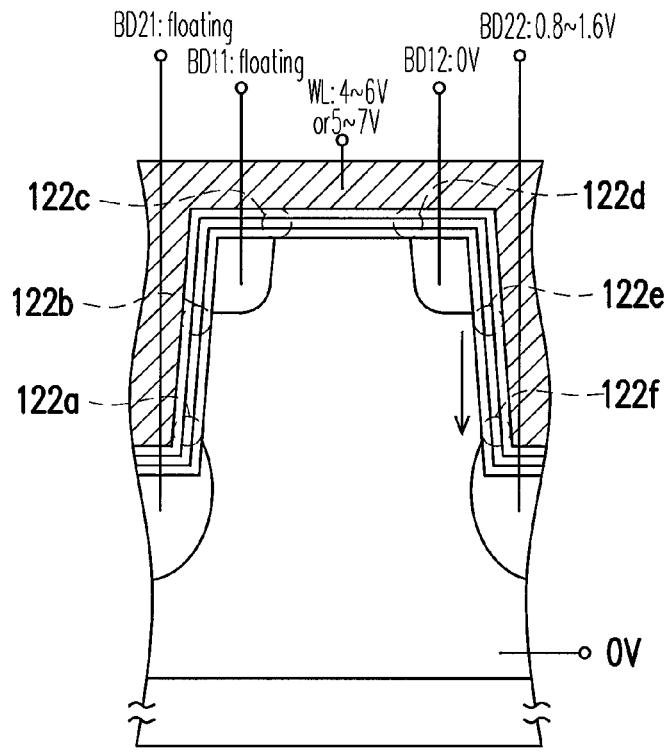

As shown in FIG. 6E, the bit 122e of the memory cell is taken as an example, wherein the electrons are stored in the bit 122e. In the reverse read operation, the voltage Vr1 is applied to the word line WL. The voltage Vr2 is applied to the first doped region BD12 which is the selected doped region connected with the selected bit. The voltage Vr3 is applied to the second doped region BD22. The voltage Vr4 is applied to the well region. The first doped region BD11 and the second doped regions BD21 which are not the non-selected doped regions are floating. Likewise, the current flows from the first doped region BD12 to the second doped region BD22, and accordingly, the bit 122e can be verified and read.

Figure 6F:
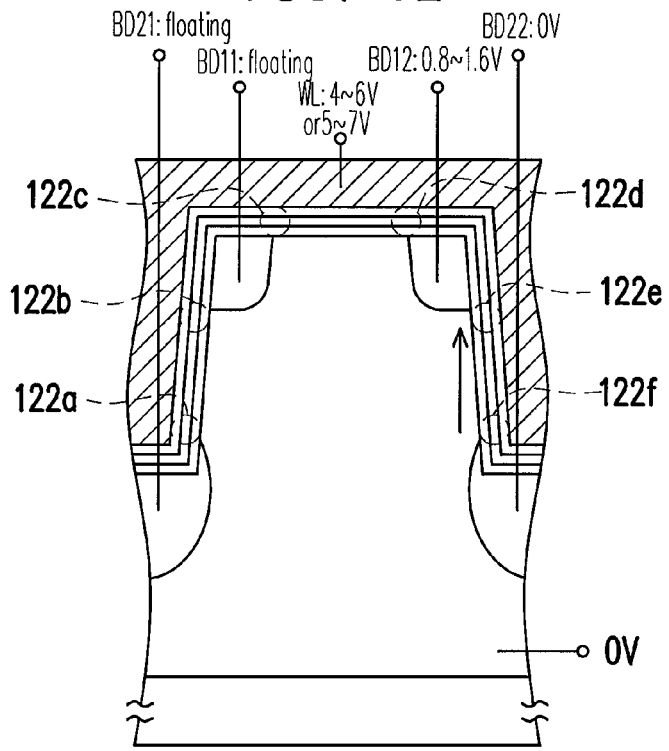

As shown in FIG. 6F, the bit 122f of the memory cell is taken as an example, wherein the electrons are stored in the bit 122f. In the reverse read operation, the voltage Vr1 is applied to the word line WL. The voltage Vr2 is applied to the second doped region BD22 which is the selected doped region connected with the selected bit. The voltage Vr3 is applied to the first doped region BD12. The voltage Vr4 is applied to the well region. The first doped region BD11 and the second doped regions BD21 which are not the non-selected doped regions are floating. Likewise, the current flows from the second doped region BD22 to the first doped region BD12, and accordingly, the bit 122f can be verified and read.

In the operating method of the memory device in an embodiment of the present invention, the single bit can be programmed by means of the channel hot electron injection (CHEI), and erased by means of the band-to-band tunneling hot hole (BTBTHH) injection. Since six physical bits are contained in the single memory cell for storing the electrons, the memory device can have a relatively high storage density. Moreover, when the multi-level cell (MLC) technique is applied to the operation of the memory device, each physical bit may store multiple levels of electrical state so that the storage density can be further enhanced.

The methods for fabricating the foregoing memory device according to several embodiments of this invention are then described with cross-sectional diagrams as follows. The following fabricating methods merely demonstrate the procedures for constructing the structure of the memory device shown in FIG. 1B in detail, which enable one of ordinary skill in the art to practice the present invention but are not intended to limit the scope of this invention.

Figure 7A:
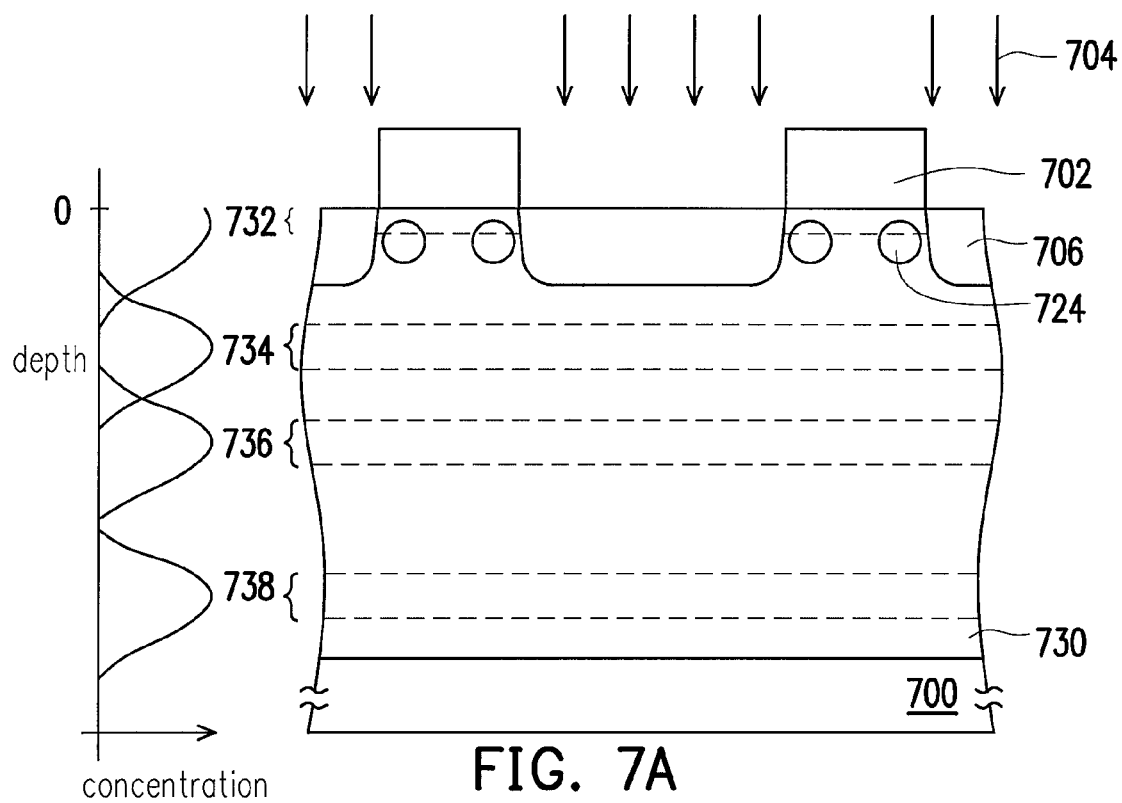
FIGS. 7A-7C depict, in a cross-sectional view, a method for fabricating the memory device according to an embodiment of the present invention.
Figure 7B:
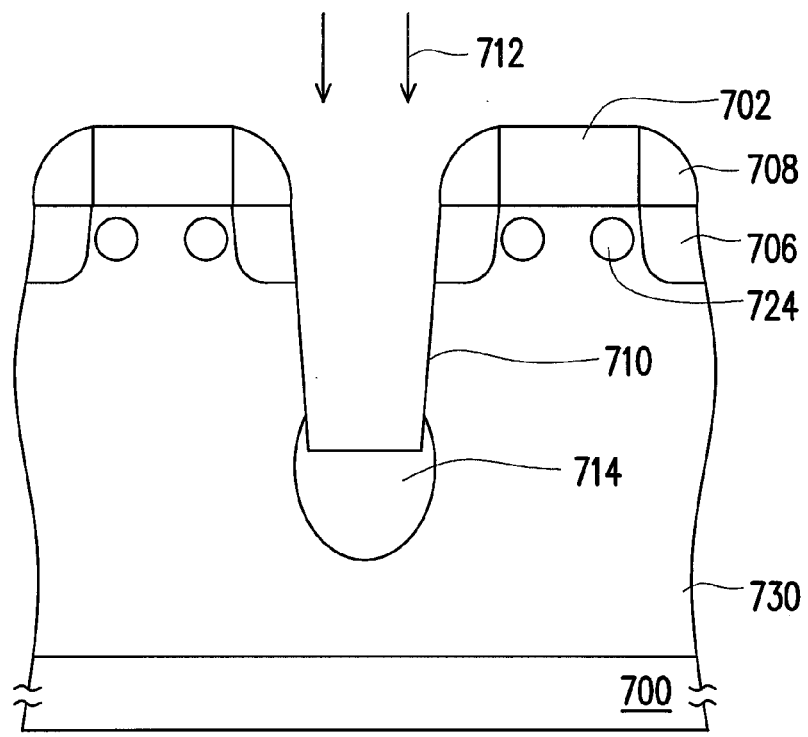
Figure 7C:
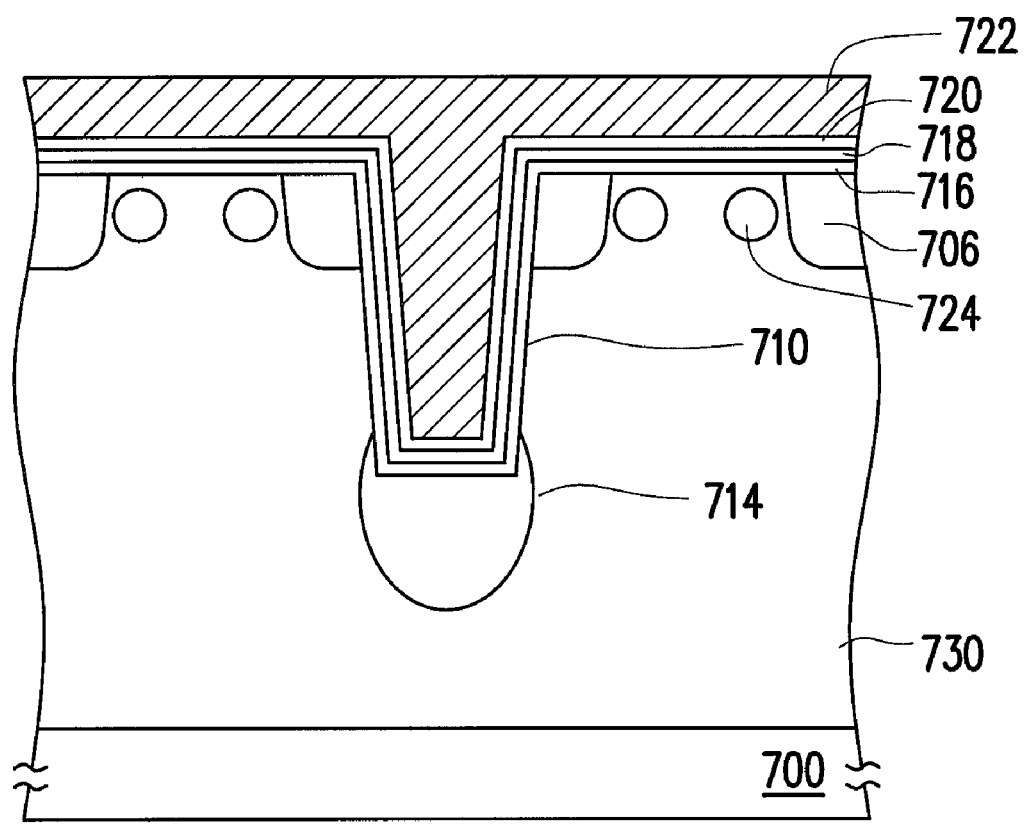

FIGS. 7A-7C depict, in a cross-sectional view, a method for fabricating the memory device according to an embodiment of the present invention.

Referring to FIG. 7A, a substrate 700 is provided, which may be P-type or an N-type silicon substrate, a P-type or an N-type epi-silicon substrate or a P-type or an N-type semiconductor-on-insulator (SOI) substrate. A P-well or an N-well region 730 may be formed in the P-type or N-type substrate 700, respectively. In an embodiment, the well region 730 can be formed by multiple well implants. In other words, the well region 730 can be formed by implanting to regions 732, 734, 736 and 738, such that distribution of the dopant concentration implanted to the respective regions 732, 734, 736 and 738 are illustrated in FIG. 7A. Accordingly, the dopant concentration distributed over the well region 730 varies with the depth of the substrate 700. The well region 730 with an uneven distribution of the dopant concentration can maintain similar threshold voltage Vt and programming efficiency of the six bits in each memory cell to be formed, and also keep punch immunity of the bottom junctions better than the vertical channel. In an embodiment, with less thermal budget following the multiple well implants, four implants may be required for controlling the performance of six bits and deeper well formation. In an embodiment, with heavy thermal budget following the multiple well implants, three implants may be required for controlling the performance of six bits and deeper well formation. It is noted that the memory device is designed to form in the well region 730, and the multiple well implant thus include at least the implantation of the deepest region, i.e. region 738.

A patterned hard mask layer 702 is formed on the substrate 700. An implantation process 704 is then conducted for implanting dopants into the substrate 700 to form first doped regions 706 therein by using the patterned hard mask layer 702 as a mask. The first doped regions 706 may be N-type doped regions formed in the P-type substrate 700, while the first doped regions 706 may be P-type doped regions formed in the N-type substrate 700. The implantation process 704 can perform a single implantation or double implantations for further deepening the depth of the first doped regions 706. In an embodiment, when the N-type first doped regions 706 is formed by the single implantation, the implantation process 704 can be conducted under the energy of 2~15 KeV with the dosage of 1e15~3e15 cm$^{-2}$. In an embodiment, when the N-type first doped regions 706 is formed by the double implantations to deepen the depth thereof, the implantation process 704 can be conducted under the energy of 2~15 KeV with the dosage of 1e15~2e15 cm$^{-2}$, and then under the energy of 25~70 KeV with the dosage of 5e13~1e15 cm$^{-2}$. In an embodiment, pocket regions 724 are further formed in the substrate 700 under the patterned hard mask layer 702 and adjacent to each first doped region 706, respectively. The pocket regions 724 can be applied for better punch immunity of the planar channel cell. The pocket regions 724 are formed, for example, by implanting the dopant with a tilted angle.

Referring to FIG. 7B, spacers 708 are formed on the sidewalls of the patterned hard mask layer 702 over the substrate 700. The spacers 708, for example, cover a portion of the first doped regions 706. Thereafter, a trench 710 is formed in the substrate 700. The method for forming the trench 710 may be performing an etching process using the patterned hard mask layer 702 and the spacers 708 as masks. In an embodiment, an extending direction of the bottom of the trench 710 and sidewalls of the trench 710 form an included angle within a range of 75° to 90°. That is to say, the trench 710 may have sloped sidewalls. An implantation process 712 is then conducted for implanting dopants into the substrate 700 under the bottom of the trench 710 to form a second doped region 714 therein by using the patterned hard mask layer 702 and the spacers 708 as masks. The second doped regions 714 can further extend from the bottom of the trench 710 to the lower portion of the trench 710. The second doped region 714 may be N-type doped regions formed in the P-type substrate 700, while the second doped region 714 may be P-type doped regions formed in the N-type substrate 700. Likewise, the implantation process 712 can perform a single implantation or double implantations to further deepen the depth of the second doped region 714. In an embodiment, when the N-type second doped region 714 is formed by the single implantation, the implantation process 712 can be conducted under the energy of 2~15 KeV with the dosage of 1e15~3e15 cm$^{-2}$. In an embodiment, when the N-type second doped region 714 is formed by the double implantations, the implantation process 712 can be conducted under the energy of 2~15 KeV with the dosage of 1e15~2e15 cm$^{-2}$, and then under the energy of 25~70 KeV with the dosage of 5e13~1e15 cm$^{-2}$. It is noted that the dopants implanted into the first doped regions 706 can be the same as, or different from that implanted into the second doped region 714.

Referring to FIG. 7C, the patterned hard mask layer 702 and the spacers 708 are removed. Afterwards, a bottom dielectric layer 716, a charge storage layer 718 and a top dielectric layer 720 are conformally formed on the substrate 700 in sequence. The material of the bottom dielectric layer 716 is, for example, a low-K material or a high-K material. The bottom dielectric layer 716 can be formed in the form of a single-layer structure or in the form of a multi-layered structure based on the band-gap engineering (BE) theory. In an embodiment, the single film of the bottom dielectric layer 716 may be silicon oxide or HfAlO. In an embodiment, the bottom dielectric layer 716 can be a stacked structure of low K/high K materials or a stacked structure of low K/high K/low K materials, such as silicon oxide/HfSiO, silicon oxide/HfO$_2$, silicon oxide/silicon nitride, silicon oxide/silicon nitride/silicon oxide, or silicon oxide/Al$_2$O$_3$/silicon oxide. The material of the charge storage layer 718 includes charge trapping materials, e.g. silicon nitride or silicon-rich nitride. The material of the top dielectric layer 720 is, for example, a low-K material or a high-K material. The top dielectric layer 720 could be formed in the form of a single-layer structure or in the form of a multi-layered structure based on the band-gap engineering (BE) theory. In an embodiment, the material of the single-layered top dielectric layer 720 may be silicon oxide, HfAlO or Al$_2$O$_3$. In an embodiment, the top dielectric layer 720 can includes stacked films of silicon nitride/silicon oxide, or silicon oxide/silicon nitride/silicon oxide.

Referring to FIG. 7C again, a conductive layer 722 is then formed on the substrate 700. The conductive layer 722 may cover the top dielectric layer 720 and fill the trench 710. The material of the conductive layer 722 is, for example, doped polysilicon, metal, or a combination of polysilicon and metal. Thereafter, the conductive layer 722 is patterned to form the word lines. A dielectric layer serving as the ILD, contact plugs and metal bit lines can further be formed on the substrate 700, such that the memory device in an embodiment of the present invention is accomplished. It should be noted that the forming methods and forming sequences of the above-mentioned components, i.e. the ILD, the contact plugs and the metal bit lines, are well appreciated by persons skilled in the art, and thus, the detailed descriptions thereof are not described herein.

Figure 8A:
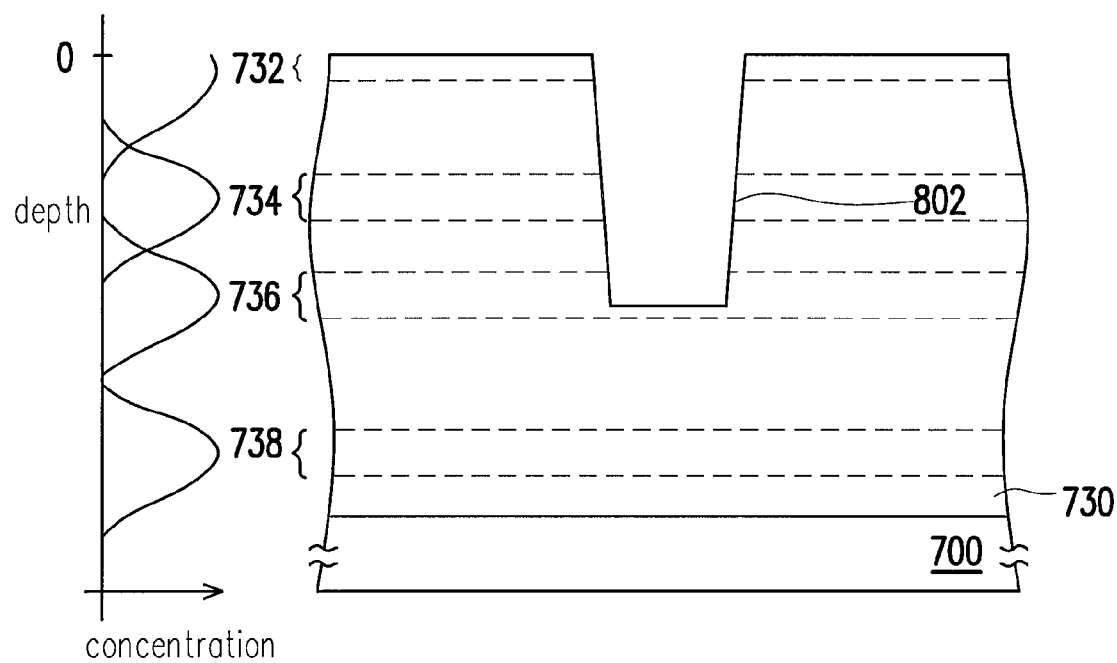
FIGS. 8A-8C depict, in a cross-sectional view, a method for fabricating the memory device according to another embodiment of the present invention.
Figure 8B:
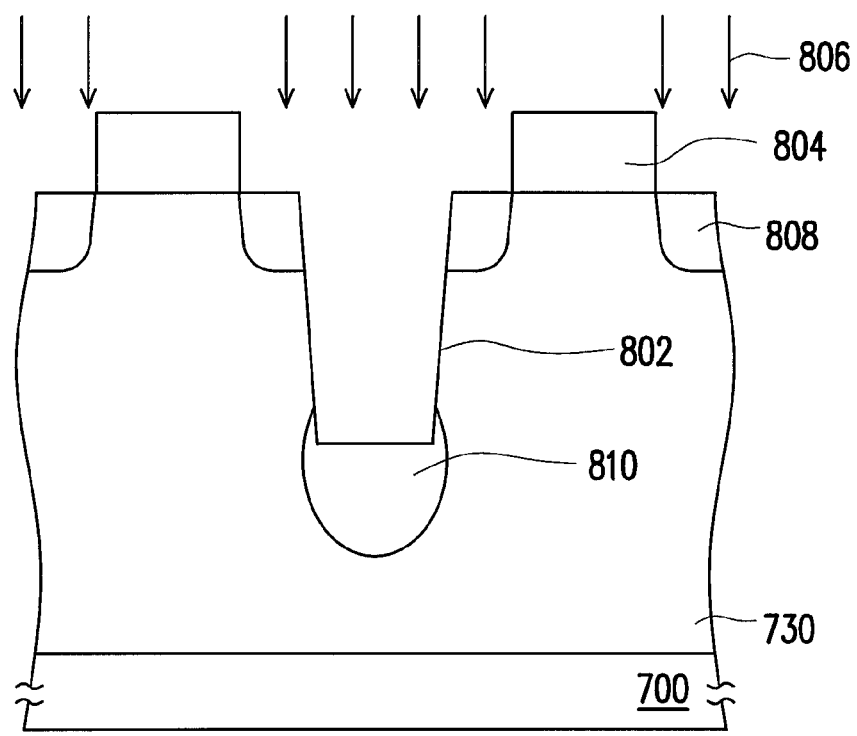
Figure 8C:
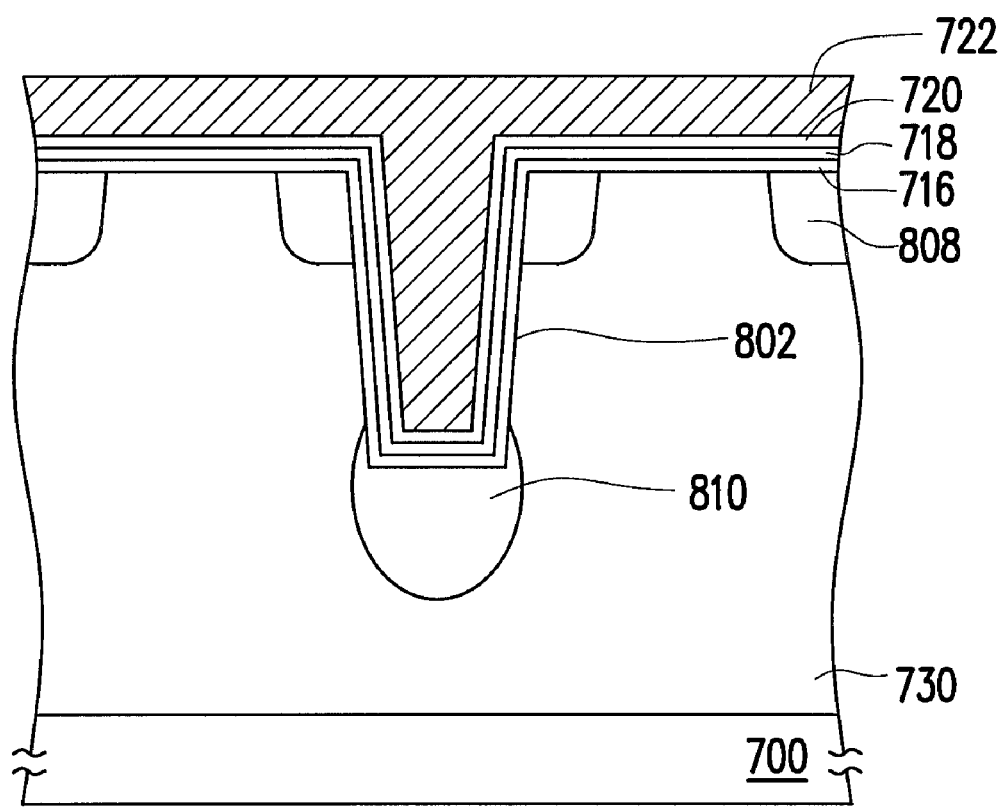

FIGS. 8A-8C depict, in a cross-sectional view, a method for fabricating the memory device according to another embodiment of the present invention. It is noted that the identical elements shown in FIGS. 7A-7C and in FIGS. 8A-8C are designated with the same reference numbers, and the detailed descriptions of the same or like elements are omitted hereinafter.

Referring to FIG. 8A, a substrate 700 is provided. Then, a trench 802 is formed in the substrate 700. In an embodiment, an extending direction of the bottom of the trench 802 and sidewalls of the trench 802 form an included angle within a range of 75° to 90°. In an embodiment, the trench 802 may have sloped sidewalls.

Referring to FIG. 8B, a patterned mask layer 804 is formed on the substrate 700. The patterned mask layer 804 may be a photoresist layer. An implantation process 806 is then conducted for implanting dopants into the substrate 700 to form first doped regions 808 and a second doped region 810 therein by using the patterned mask layer 804 as a mask. The first doped regions 808 are, for example, formed in the exposed surface of the substrate 700. The second doped region 810 is, for example, formed under the bottom of the trench 802. The second doped region 810 may further extend from the bottom of the trench 802 to the lower portion of the trench 802. The first doped regions 808 and the second doped region 810 may be N-type doped regions formed in the P-type substrate 700, or P-type doped regions formed in the N-type substrate 700. The implantation process 806 can perform a single implantation or double implantations for further deepening the depth of the doped regions. In an embodiment, the implantation process 806 includes a single implantation step, which can be conducted under the energy of 2~15 KeV with the dosage of 1e15~3e15 cm$^{-2}$. In an embodiment, the implantation process 806 includes a two-stepped implantation, which can be conducted under the energy of 2~15 KeV with the dosage of 1e15~2e15 cm$^{-2}$, and then under the energy of 25~70 KeV with the dosage of 5e13~1e15 cm$^{-2}$.

Referring to FIG. 8C, the patterned mask layer 804 is removed. Afterwards, a bottom dielectric layer 716, a charge storage layer 718 and a top dielectric layer 720 are conformally formed on the substrate 700 in sequence. Thereafter, a conductive layer 722 is formed on the substrate 700, and is then patterned to form the word lines. The conductive layer 722 may cover the top dielectric layer 720 and fill the trench 710. The ILD, the contact plugs and the metal bit lines may be further formed on the substrate 700 to complete the structure of the memory device.

Figure 9A:
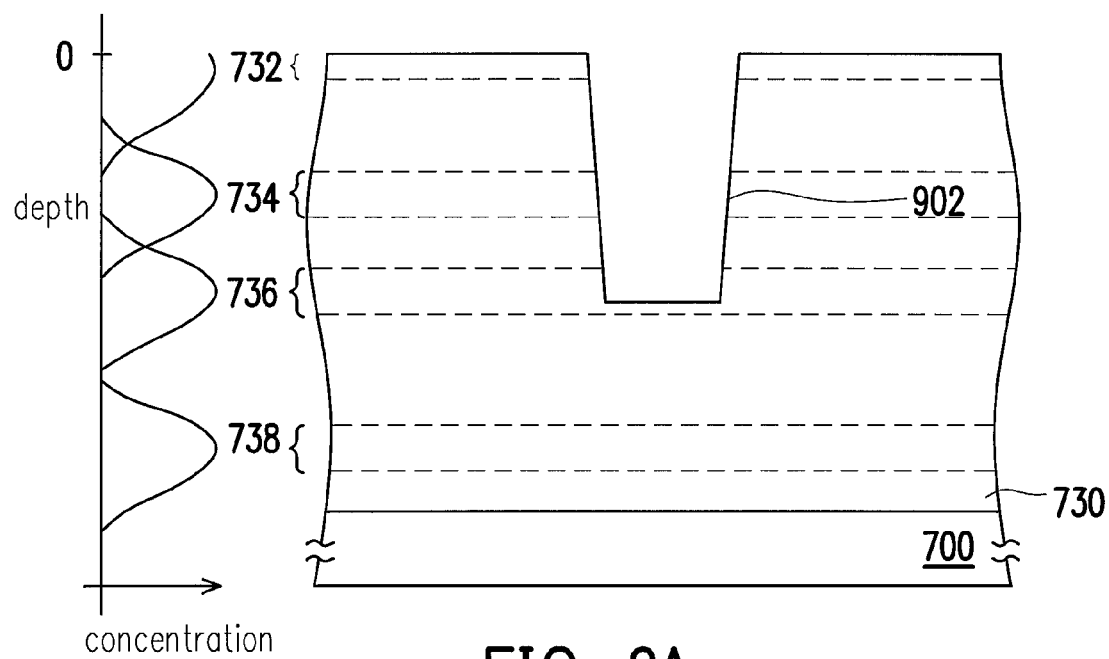
FIGS. 9A-9C depict, in a cross-sectional view, a method for fabricating the memory device according to another embodiment of the present invention.
Figure 9B:
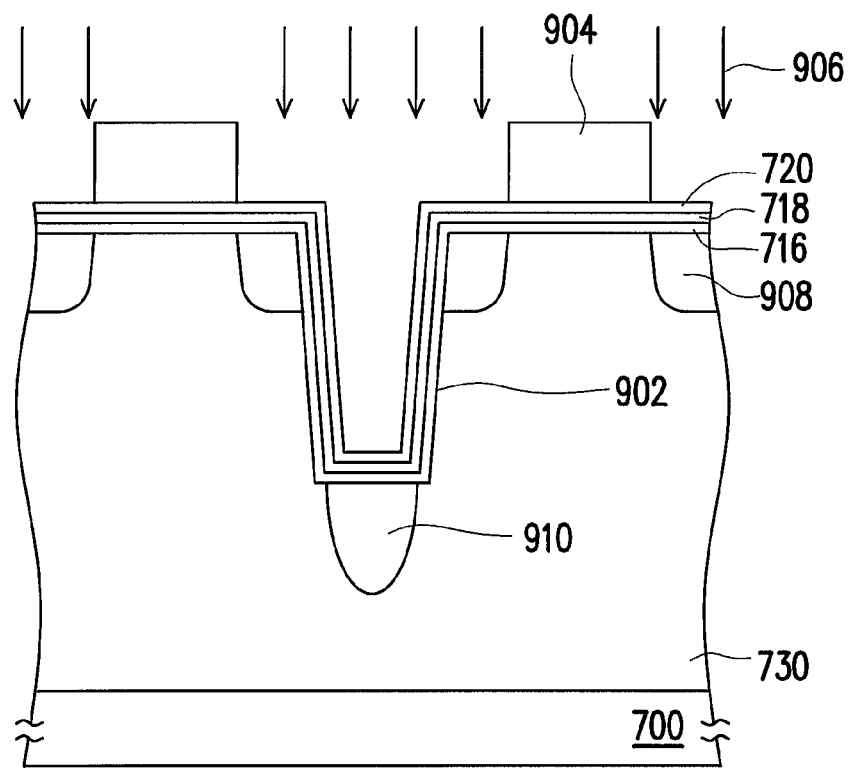
Figure 9C:
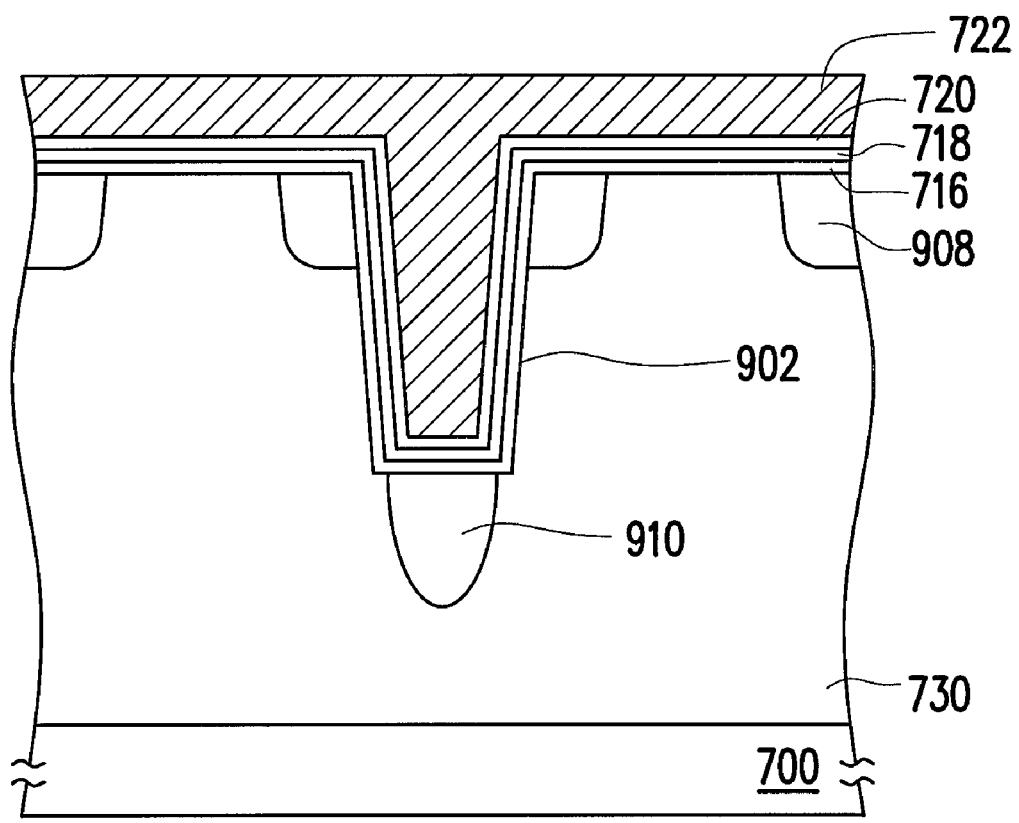

FIGS. 9A-9C depict, in a cross-sectional view, a method for fabricating the memory device according to another embodiment of the present invention. It is noted that the identical elements shown in FIGS. 7A-7C and in FIGS. 9A-9C are designated with the same reference numbers, and the detailed descriptions of the same or like elements are omitted hereinafter.

Referring to FIG. 9A, a substrate 700 is provided. Then, a trench 902 is formed in the substrate 700. In an embodiment, an extending direction of the bottom of the trench 902 and sidewalls of the trench 902 form an included angle within a range of 75° to 90°. In an embodiment, the trench 902 may have sloped sidewalls.

Referring to FIG. 9B, a bottom dielectric layer 716, a charge storage layer 718 and a top dielectric layer 720 are conformally formed on the substrate 700 in sequence. Afterwards, a patterned mask layer 904 is formed on the substrate 700. The patterned mask layer 904 may be a photoresist layer. An implantation process 906 is then conducted for implanting dopants into the substrate 700 to form first doped regions 908 and a second doped region 910 therein by using the patterned mask layer 904 as a mask. The first doped regions 908 are, for example, formed in the exposed surface of the substrate 700. The second doped region 910 is, for example, formed right under the bottom of the trench 902 without an extension to the sidewalls of the trench 902. The first doped regions 908 and the second doped region 910 may be N-type doped regions formed in the P-type substrate 700, or P-type doped regions formed in the N-type substrate 700. The implantation process 906 can perform a single implantation or double implantations for further deepening the depth of the doped regions. It is noted that the energy for the implantation process 906 may be higher due to the stacked layer formed on the substrate 700. In an embodiment, the implantation process 906 includes a single implantation step, which can be conducted under the energy of 15~25 KeV with the dosage of 1e15~3e15 cm$^{-2}$. In an embodiment, the implantation process 906 includes a two-stepped implantation, which can be conducted under the energy of 15~25 KeV with the dosage of 1e15~2e15 cm$^{-2}$, and then under the energy of 55~90 KeV with the dosage of 5e13~1e15 cm$^{-2}$.

Referring to FIG. 9C, the patterned mask layer 904 is removed. Thereafter, a conductive layer 722 is formed on the substrate 700. The conductive layer 722 covers the top dielectric layer 720 and fill the trench 710. The conductive layer 722 is then patterned to form the word lines. Afterwards, the ILD, the contact plugs and the metal bit lines may be further formed on the substrate 700 to complete the structure of the memory device.

The memory device formed by the foregoing methods includes a vertical memory structure and a lateral memory structure in the single memory cell. Accordingly, the memory device is a 6-bit-per-cell non-volatile memory with relatively high storage density.

In view of the above, the memory device of the present invention combines a planar channel cell and a vertical channel cell, so as to include six physical bits for storing data in each memory cell or memory unit. Therefore, the storage density is increased with the same array area, and the operation of each bit can be well isolated.

Moreover, the method for fabricating the memory device of the present invention forms the charge storage layer for trapping the electrons therein, and also forms the first and the second doped regions separated from each other in the substrate. The fabrication can be easily incorporated into the current process. Hence, not only the process is simplified without raising the cost, the storage density can be more effectively improved.

Further, the method for operating the memory device of the present invention can effectively alleviates the mutual perturbation and the programming disturbance. In addition, the memory cell can be operated as the multi-level cell (MLC) for storing multiple levels of electrical state per physical bit, so that the storage density can be further enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
    a substrate having a plurality of trenches formed therein, wherein the trenches comprise sloped sidewalls;
    a conductive layer, disposed on the substrate and filling the trenches;
    a charge storage layer, disposed between the substrate and the conductive layer;
    a plurality of first doped regions, configured in the substrate adjacent to both sides of an upper portion of each trench respectively, wherein the first doped regions between the neighbouring trenches are separated from each other;
    a plurality of second doped regions, configured in the substrate under bottoms of the trenches respectively, wherein the second doped regions and the first doped regions are separated from each other, such that each memory cell comprises six physical bits; and
    a well region, configured in the substrate, wherein a dopant concentration distributed over the well region varies with a depth of the substrate.

2. The memory device according to claim 1, wherein an extending direction of the bottoms of the trenches and sidewalls of the trenches form an included angle within a range of 75° to 90°.

3. The memory device according to claim 1, wherein the bottoms of the trenches are orthogonal, rounded or polygonal.

4. The memory device according to claim 1, wherein the second doped regions are right below the bottoms of the trenches, or further extend from the bottoms of the trenches to both sides of a lower portion of each trench respectively.

5. The memory device according to claim 1, further comprising:
    a bottom dielectric layer, disposed between the charge storage layer and the substrate; and
    a top dielectric layer, disposed between the charge storage layer and the conductive layer.

6. The memory device according to claim 1, wherein a material of the charge storage layer comprises silicon nitride or silicon-rich nitride.

7. A method for fabricating a memory device, comprising:
    providing a substrate;
    forming a plurality of trenches in the substrate, wherein the trenches comprise sloped sidewalls;
    forming a plurality of first doped regions in the substrate adjacent to both sides of an upper portion of each trench respectively, wherein the first doped regions between the neighbouring trenches are separated from each other;
    forming a plurality of second doped regions in the substrate under bottoms of the trenches respectively;
    forming a charge storage layer conformally on the substrate and on a surface of the trenches;
    forming a conductive layer on the charge storage layer, wherein the conductive layer fills the trenches; and
    forming a well region in the substrate, wherein a dopant concentration distributed over the well region varies with a depth of the substrate, and six physical bits are formed in the charge storage layer in a single memory cell at junctions of the first doped regions and the second doped regions respectively.

8. The method according to claim 7, wherein methods for forming the trenches, the first doped regions and the second doped regions comprises:
    forming a patterned mask layer on the substrate;
    forming the first doped regions in the substrate exposed by the patterned mask layer;
    forming spacers on sidewalls of the patterned mask layer, wherein the spacers cover a portion of the first doped region;
    forming the trenches in the substrate exposed by the patterned mask layer and the spacers, wherein the trenches are through the first doped regions respectively;
    forming the second doped regions under the bottoms of the trenches in the substrate exposed by the patterned mask layer and the spacers; and
    removing the patterned mask layer and the spacers.

9. The method according to claim 7, wherein methods for forming the trenches, the first doped regions and the second doped regions comprises:
    forming the trenches in the substrate;
    forming a patterned mask layer on the substrate;
    forming the first doped regions and the second doped regions simultaneously in the substrate exposed by the patterned mask layer; and
    removing the patterned mask layer.

10. The method according to claim 9, wherein the patterned mask layer is formed before the charge storage layer is formed or after the charge storage layer is formed.

11. The method according to claim 7, wherein an extending direction of the bottoms of the trenches and sidewalls of the trenches form an included angle within a range of 75° to 90°.

12. The method according to claim 7, wherein the bottoms of the trenches are orthogonal, rounded or polygonal.

13. The method according to claim 7, further comprising:
    forming a plurality of first contacts on the first doped regions; and
    forming a plurality of second contacts on the second doped regions.

14. The method according to claim 7, further comprising:
    forming a bottom dielectric layer between the charge storage layer and the substrate; and
    forming a top dielectric layer between the charge storage layer and the conductive layer.

15. A method for operating a memory device, comprising:
    providing a memory cell, comprising:
    a substrate having two trenches formed therein;

a conductive layer, disposed on the substrate and filling the trenches;

a charge storage layer, disposed between the substrate and the conductive layer;

two first doped regions, configured in the substrate adjacent to an upper portion of each trench respectively, wherein the first doped regions between the neighbouring trenches are separated from each other; and two second doped regions, configured in the substrate under bottoms of the trenches respectively, wherein the second doped regions and the first doped regions are separated from each other, such that six bits are formed in the charge storage layer at junctions of the first doped regions and the second doped regions respectively;

when performing a programming operation, applying a first voltage to the conductive layer, applying a second voltage to a selected doped region adjacent to a selected bit, applying a third voltage to one of non-selected doped regions neighboring with the selected bit along the conductive layer, applying a fourth voltage to the substrate, and floating the other two non-selected doped regions, wherein the first voltage is higher than the fourth voltage, and the second voltage is higher than the third voltage to program the selected bit.

16. The method according to claim 15, wherein the first voltage is about 9 V to 13 V, the second voltage is about 3.5 V to 5.5 V, the third voltage is about 0 V, and the fourth voltage is about 0 V.

17. The method according to claim 15, wherein the memory cell is operated as a multi-level cell (MLC).

18. The method according to claim 15, after the programming operation is performed, further comprising:

performing an erasing operation, applying a fifth voltage to the conductive layer, applying a sixth voltage to all doped regions, and applying a seventh voltage to the substrate for block erase, wherein the fifth voltage and the sixth voltage induce hot hole injection to erase a selected block.

19. The method according to claim 18, wherein the fifth voltage is about −5 V to −9 V, the sixth voltage is about 2.5 V to 5.5 V, and the seventh voltage is about 0 V to −2 V.

20. The method according to claim 15, after the programming operation is performed, further comprising:

performing a reading operation, applying a eighth voltage to the conductive layer, applying a ninth voltage to the selected doped region adjacent to the selected bit, applying a tenth voltage to one of the non-selected doped regions neighboring with the selected bit along the conductive layer, applying a eleventh voltage to the substrate, and floating the other two non-selected doped regions, wherein the tenth voltage is higher than the ninth voltage.

21. The method according to claim 20, wherein the memory cell is operated as a single-level cell (SLC).

22. The method according to claim 21, wherein the eighth voltage is about 4 V to 6 V, the ninth voltage is about 0 V, and the tenth voltage is about 0.8 V to 1.6 V, and the eleventh voltage is about 0 V.

23. The method according to claim 20, wherein the memory cell is operated as a multi-level cell (MLC).

24. The method according to claim 23, wherein the eighth voltage is about 5 V to 7 V, the ninth voltage is about 0 V, the tenth voltage is about 0.8 V to 1.6 V, and the eleventh voltage is about 0 V.

* * * * *